United States Patent
Ikeda et al.

(10) Patent No.: US 11,894,040 B2
(45) Date of Patent: Feb. 6, 2024

(54) SEMICONDUCTOR DEVICE AND WIRELESS COMMUNICATION DEVICE

(71) Applicant: SEMICONDUCTOR ENERGY LABORATORY CO., LTD., Atsugi (JP)

(72) Inventors: Takayuki Ikeda, Kanagawa (JP); Hitoshi Kunitake, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 124 days.

(21) Appl. No.: 17/615,867

(22) PCT Filed: Jun. 30, 2020

(86) PCT No.: PCT/IB2020/056151
§ 371 (c)(1),
(2) Date: Dec. 2, 2021

(87) PCT Pub. No.: WO2021/009591
PCT Pub. Date: Jan. 21, 2021

(65) Prior Publication Data
US 2022/0310148 A1   Sep. 29, 2022

(30) Foreign Application Priority Data
Jul. 12, 2019   (JP) .................... 2019-129925

(51) Int. Cl.
*G11C 11/405*   (2006.01)
*H01L 27/12*   (2006.01)
(Continued)

(52) U.S. Cl.
CPC ........ *G11C 11/405* (2013.01); *H01L 27/1207* (2013.01); *H01L 27/1225* (2013.01);
(Continued)

(58) Field of Classification Search
CPC ..... G11C 11/405; G11C 11/4096; G11C 7/16; G11C 27/00; H01L 29/78648;
(Continued)

(56) References Cited

U.S. PATENT DOCUMENTS 8,659,529 B2   2/2014   Kimura et al.
9,595,955 B2   3/2017   Kurokawa et al.
(Continued)

FOREIGN PATENT DOCUMENTS

CN   001739133 A   2/2006
EP   1585098 A   10/2005
(Continued)

OTHER PUBLICATIONS

International Search Report (Application No. PCT/IB2020/056151) dated Oct. 6, 2020.

(Continued)

*Primary Examiner* — Sultana Begum
(74) *Attorney, Agent, or Firm* — NIXON PEABODY LLP; Jeffrey L. Costellia

(57) ABSTRACT

To provide a semiconductor device with a novel structure. The semiconductor device includes a plurality of constant current circuits each given a digital signal. The constant current circuits each include a first transistor to a third transistor. The first transistor has a function of making a first current corresponding to set analog potential flow therethrough. The second transistor has a function of controlling the first current flowing between a source and a drain of the first transistor, in response to the digital signal. The third transistor has a function of holding the analog potential supplied to a gate of the first transistor, by being turned off. The first transistor to the third transistor each include a semiconductor layer including an oxide semiconductor in a channel formation region.

8 Claims, 20 Drawing Sheets

(51) Int. Cl.
*H01L 29/786* (2006.01)
*H03K 3/012* (2006.01)
*H10B 12/00* (2023.01)

(52) U.S. Cl.
CPC ...... *H01L 27/1255* (2013.01); *H01L 29/7869* (2013.01); *H01L 29/78648* (2013.01); *H03K 3/012* (2013.01); *H10B 12/00* (2023.02)

(58) Field of Classification Search
CPC . H01L 29/7869; H01L 29/78; H01L 21/8258; H03K 3/012; H10B 12/00; H03M 1/74; H04B 1/40
See application file for complete search history.

(56) References Cited

U.S. PATENT DOCUMENTS

| | | | |
|---|---|---|---|
| 9,626,913 B2 | 4/2017 | Kimura et al. | |
| 9,742,356 B2 | 8/2017 | Takahashi et al. | |
| 10,033,379 B2 | 7/2018 | Kurokawa et al. | |
| 2004/0232952 A1 | 11/2004 | Kimura et al. | |
| 2016/0043715 A1 | 2/2016 | Kurokawa et al. | |
| 2022/0293049 A1* | 9/2022 | Godo | H01L 27/1207 |

FOREIGN PATENT DOCUMENTS

| | | |
|---|---|---|
| JP | 2016-039634 A | 3/2016 |
| KR | 2005-0101175 A | 10/2005 |
| WO | WO-2004/066248 | 8/2004 |

OTHER PUBLICATIONS

Written Opinion (Application No. PCT/IB2020/056151) dated Oct. 6, 2020.

Huang.H et al., "A 0.07mm$^2$ 210mW Single-1.1V-Supply 14-bit 10GS/s DAC with Concentric Parallelogram Routing and Output Impedance Compensation", 2019 Symposium on VLSI Circuits Digest of Technical Papers, Jun. 9, 2019, pp. C136-C137.

\* cited by examiner

FIG. 14A
Intermediate state
New boundary region
| Amorphous | Crystalline | Crystal |
|---|---|---|
| • completely amorphous | • CAAC<br>• nc<br>• CAC<br><br>excluding single crystal and poly crystal | • single crystal<br>• poly crystal |
FIG. 14B
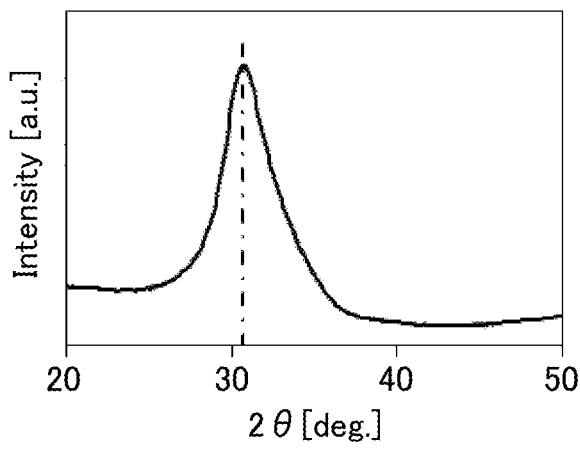
FIG. 14C
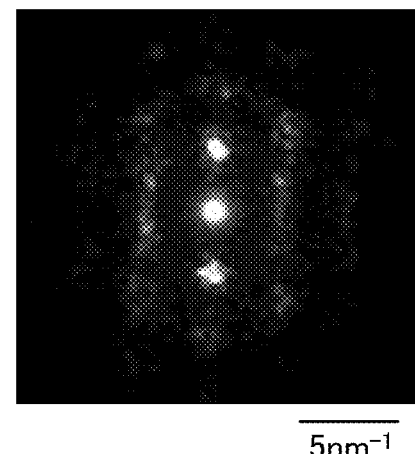

SEMICONDUCTOR DEVICE AND WIRELESS COMMUNICATION DEVICE

TECHNICAL FIELD

One embodiment of the present invention relates to a semiconductor device and a wireless communication device including the semiconductor device.

In this specification and the like, a semiconductor device means every device that can function by utilizing semiconductor characteristics. It can be sometimes said that a display device (a liquid crystal display device, a light-emitting display device, and the like), a projection device, a lighting device, an electro-optical device, a power storage device, a memory device, a semiconductor circuit, an imaging device, a sensor device, and the like include a semiconductor device.

BACKGROUND ART

The amount of data to be transmitted and received has been increased by the development of information technology such as IoT (Internet of Things). In order to address the increase in data amount, a new communication standard called the fifth-generation mobile communication system (5G) that achieves higher transmission speed, more simultaneous connections, and shorter delay time than the fourth-generation mobile communication system (4G) has been examined.

For mobile communication and the like, in addition to higher performance such as higher communication speed, a reduction in power consumption and miniaturization of a semiconductor integrated circuit (IC) are required to be achieved. Thus, in electronic devices conforming to the 5G communication standard, a reduction in power consumption and miniaturization of a circuit are significantly important.

Electronic devices conforming to the 5G communication standard include a high-frequency circuit for transmitting and receiving high-frequency signals. The high-frequency circuit is provided with a digital-to-analog converter circuit (Digital to Analog Converter: hereinafter, DAC) for converting a digital signal into an analog signal. The DAC is preferably capable of changing the setting of a bias voltage in order to modulate signals and increase power efficiency. In addition, the DAC needs to have conversion accuracy; thus, a configuration for increasing the accuracy and the like are examined (see Non-Patent Document 1, for example)

REFERENCE

Non-Patent Document

[Non-Patent Document 1] Hung-Yi Huang and Tai-Haur Kuo, "2019 Symposium on VLSI Technology Digest of Technical Papers", 2019, pp. C136-C137

SUMMARY OF THE INVENTION

Problems to be Solved by the Invention

A circuit provided on the analog front end side in a high-frequency circuit preferably has high resistance to a high voltage and is often formed using transistors that have the same conductivity type and use a compound semiconductor such as GaN. For high-speed operation of a DAC, a circuit configuration such as a decode type, a binary type, or a segment type is employed. However, the circuit area of a DAC such as a decode-type DAC, a binary-type DAC, or a segment-type DAC increases as the number of bits increases. A DAC that is used for a high-frequency circuit is required to operate at high speed.

In addition, power saving is important for a high-frequency circuit. To make a high-frequency circuit operate efficiently, a DAC that supplies a bias voltage in the high-frequency circuit is preferably capable of changing the bias voltage so that impedance correction can be performed. However, when a bias voltage is output to the high-frequency circuit on the analog front end side from a digital baseband circuit, the distance between the circuits increases. For power saving, the DAC that supplies a bias voltage is preferably close to the analog front end.

An object of one embodiment of the present invention is to provide a semiconductor device with a novel structure that can operate without lowering accuracy. An object of one embodiment of the present invention is to provide a semiconductor device with a novel structure that can be miniaturized. An object of one embodiment of the present invention is to provide a semiconductor device with a novel structure that can reduce power consumption. An object of one embodiment of the present invention is to provide a novel semiconductor device and the like.

Note that the description of these objects does not preclude the existence of other objects. One embodiment of the present invention does not have to achieve all these objects. Other objects will be apparent from and can be derived from the description of the specification, the drawings, the claims, and the like.

Means for Solving the Problems

One embodiment of the present invention is a semiconductor device including a plurality of constant current circuits that are each given a digital signal, in which the constant current circuits each include a first transistor to a third transistor; the first transistor has a function of making a first current corresponding to a set analog potential flow through the first transistor; the second transistor has a function of controlling the first current flowing between a source and a drain of the first transistor, in response to the digital signal; the third transistor has a function of holding the analog potential supplied to a gate of the first transistor, by being turned off; and the first transistor to the third transistor each include a semiconductor layer including an oxide semiconductor in a channel formation region.

One embodiment of the present invention is a semiconductor device including a plurality of constant current circuits that are each given a digital signal, a load having a function of generating a voltage corresponding to currents flowing through the constant current circuits, and a buffer circuit having a function of outputting the voltage as an output voltage. In the semiconductor device, the constant current circuits each include a first transistor to a third transistor; the first transistor has a function of making a first current corresponding to a set analog potential flow through the first transistor; the second transistor has a function of controlling the first current flowing between a source and a drain of the first transistor, in response to the digital signal; the third transistor has a function of holding the analog potential supplied to a gate of the first transistor, by being turned off; and the first transistor to the third transistor each include a semiconductor layer including an oxide semiconductor in a channel formation region.

In the semiconductor device of one embodiment of the present invention, preferably, the constant current circuits are provided so as to overlap a circuit formed using a transistor including a semiconductor layer including silicon in a channel formation region.

In the semiconductor device of one embodiment of the present invention, preferably, the load includes a fourth transistor, and the fourth transistor includes a semiconductor layer including an oxide semiconductor in a channel formation region.

One embodiment of the present invention is preferably the semiconductor device according to any one of claims 1 to 3 in which the buffer circuit includes a fifth transistor and the fifth transistor includes a semiconductor layer including an oxide semiconductor in a channel formation region.

One embodiment of the present invention is preferably the semiconductor device according to any one of claims 1 to 4 in which the digital signals each include an inverted signal and a non-inverted signal and two or more first transistors are provided in accordance with the inverted signals and the non-inverted signals.

One embodiment of the present invention is a wireless communication device including an integrated circuit including an antenna, a mixer, an oscillator, and a digital-to-analog converter circuit, in which the digital-to-analog converter circuit includes a plurality of constant current circuits each given a digital signal, a load having a function of generating a voltage corresponding to currents flowing through the constant current circuits, and a buffer circuit having a function of outputting the voltage as an output voltage; the constant current circuits each include a first transistor to a third transistor; the first transistor has a function of making a first current corresponding to a set analog potential flow through the first transistor; the second transistor has a function of controlling the first current flowing between a source and a drain of the first transistor, in response to the digital signal; the third transistor has a function of holding the analog potential supplied to a gate of the first transistor, by being turned off; and the first transistor to the third transistor each include a semiconductor layer including an oxide semiconductor in a channel formation region.

In the wireless communication device of one embodiment of the present invention, preferably, the constant current circuits are provided so as to overlap a circuit formed using a transistor including a semiconductor layer including silicon in a channel formation region.

In the wireless communication device of one embodiment of the present invention, preferably, the load includes a fourth transistor, and the fourth transistor includes a semiconductor layer including an oxide semiconductor in a channel formation region.

In the wireless communication device of one embodiment of the present invention, preferably, the buffer circuit includes a fifth transistor, and the fifth transistor includes a semiconductor layer including an oxide semiconductor in a channel formation region.

In the wireless communication device of one embodiment of the present invention, preferably, the digital signals each include an inverted signal and a non-inverted signal, and two or more first transistors are provided in accordance with the inverted signals and the non-inverted signals.

Effect of the Invention

One embodiment of the present invention can provide a semiconductor device with a novel structure that can operate without lowering accuracy. One embodiment of the present invention can provide a semiconductor device with a novel structure that can be miniaturized. One embodiment of the present invention can provide a semiconductor device with a novel structure that can reduce power consumption. One embodiment of the present invention can provide a novel semiconductor device and the like.

Note that the description of these effects does not preclude the existence of other effects. One embodiment of the present invention does not have to have all these effects. Note that other effects will be apparent from and can be derived from the description of the specification, the drawings, the claims, and the like.

BRIEF DESCRIPTION OF THE DRAWINGS

FIG. 14A is a table showing the classification of crystal structures of IGZO; FIG. 14B is a graph showing an XRD spectrum of a CAAC-IGZO film; and FIG. 14C is an image showing a nanobeam electron diffraction pattern of a CAAC-IGZO film.

MODE FOR CARRYING OUT THE INVENTION

Figure 1A:
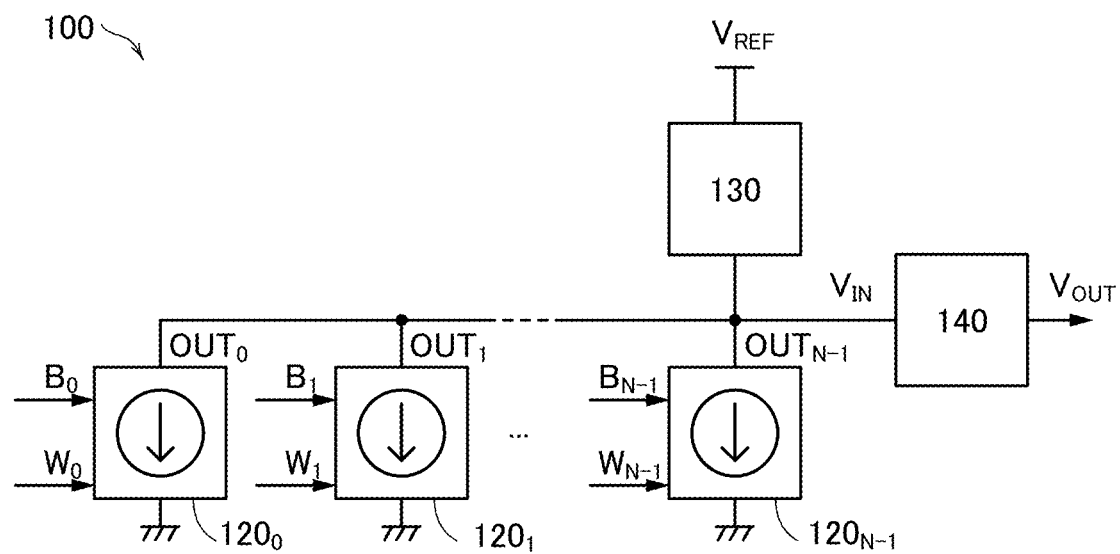
FIG. 1A and FIG. 1B are diagrams for describing a configuration of a semiconductor device.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

The same components, components having similar functions, components made of the same material, components formed at the same time, and the like in the drawings are denoted by the same reference numerals, and repeated description thereof is skipped in some cases.

In this specification, for example, a power source potential VDD may be abbreviated to a potential VDD, VDD, or the like. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "[n]", or "[m,n]" is sometimes added to the reference numerals. For example, the second wiring GL is referred to as a wiring GL[2].

Embodiment 1

The configurations and operations of semiconductor devices of embodiments of the present invention will be described with reference to FIG. 1 to FIG. 6. The semiconductor device of one embodiment of the present invention functions as a digital-to-analog converter for converting a digital signal into an analog signal, what is called a DAC (Digital to Analog Converter). The semiconductor device of one embodiment of the present invention particularly relates to a semiconductor device that functions as a DAC provided on the side of an analog front end for transmission and reception of high-frequency signals through an antenna, and a wireless communication device including the semiconductor device.

FIG. 1A is a circuit diagram for describing the configuration of a semiconductor device that functions as a DAC and can be used for a wireless communication device including the semiconductor device of one embodiment of the present invention.

A semiconductor device 100 includes a plurality of constant current circuits $120_0$ to $120_{N-1}$ (N is a natural number of two or more), a load 130, and a buffer circuit 140. For description, the load 130 and the buffer circuit 140 are illustrated in FIG. 1A but can be omitted in the case where a current value is output.

The constant current circuits $120_0$ to $120_{N-1}$ each include transistors and a capacitor. To the constant current circuits $120_0$ to $120_{N-1}$, N-bit (N is a natural number of two or more) digital signals $B_0$ to $B_{N-1}$ and N-bit analog potentials $W_0$ to $W_{N-1}$ are supplied. The constant current circuits $120_0$ to $120_{N-1}$ output output currents $OUT_0$ to $OUT_{N-1}$, current values weighed differently according to the digital signals $B_0$ to $B_{N-1}$ and the analog potentials $W_0$ to $W_{N-1}$.

The settings of the analog potentials $W_0$ to $W_{N-1}$ are each individually controllable. The analog potentials $W_0$ to $W_{N-1}$ can be generated by a voltage generation circuit provided outside the semiconductor device 100. The semiconductor device 100 has a function of holding the set analog potentials in the plurality of constant current circuits $120_0$ to $120_{N-1}$.

Although not illustrated in FIG. 1A, selection signals $S_0$ to $S_{N-1}$ for updating or holding the analog potentials $W_0$ to $W_{N-1}$ are supplied to the constant current circuits $120_0$ to $120_{N-1}$. The selection signals $S_0$ to $S_{N-1}$ are signals for controlling the on/off state of the transistor functioning as a switch.

The digital signals $B_0$ to $B_{N-1}$ are signals for controlling whether to make the output currents $OUT_0$ to $OUT_{N-1}$ flow according to the respective analog potentials set for the constant current circuits $120_0$ to $120_{N-1}$.

The load 130 has a function of generating a voltage corresponding to currents flowing through the constant current circuits $120_0$ to $120_{N-1}$. The load 130 generates a voltage corresponding to the digital signals $B_0$ to $B_{N-1}$ when the sum of the output currents $OUT_0$ to $OUT_{N-1}$ adjusted by the control of the digital signals $B_0$ to $B_{N-1}$ flows to the load 130. The load 130 is supplied with a voltage $V_{REF}$ and can be formed using a resistor or a transistor.

The buffer circuit 140 has a function of outputting the voltage of an input terminal $V_{IN}$ as an output voltage to an output terminal $V_{OUT}$. The voltage of the input terminal $V_{IN}$ of the buffer circuit 140 can be set according to a current flowing through the load 130. The voltage of the input terminal $V_{IN}$ is applied to the buffer circuit 140, and the buffer circuit 140 generates a voltage whose current supply capability or the like is amplified. The buffer circuit 140 can be formed using a resistor or a transistor.

The semiconductor device 100 illustrated in FIG. 1A can hold and rewrite the analog potentials $W_0$ to $W_{N-1}$ set for the constant current circuits $120_0$ to $120_{N-1}$. Thus, circuits that generate a plurality of analog potentials can be intermittently operated, leading to a reduction in power consumption. Correction and rewriting of the plurality of analog potentials enable a configuration in which the analog voltage output from the semiconductor device is easily corrected.

Figure 1B:
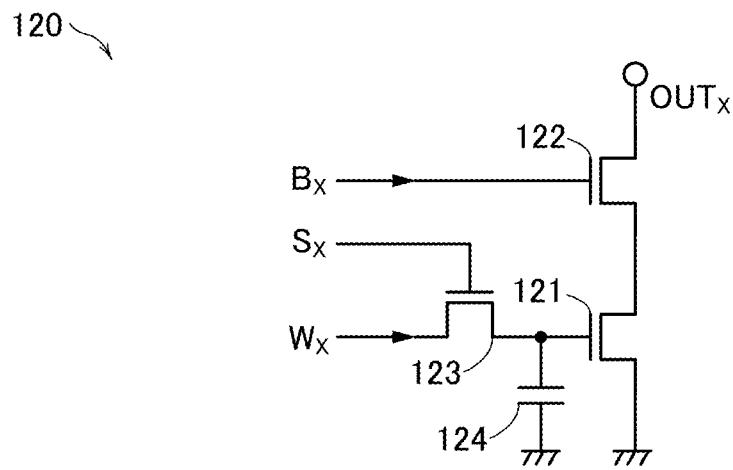

FIG. 1B is a diagram illustrating a configuration example of a constant current circuit 120 applicable to the constant current circuits $120_0$ to $120_{N-1}$.

The constant current circuit 120 includes a transistor 121, a transistor 122, a transistor 123, and a capacitor 124. In the constant current circuit 120, any one of the analog potentials $W_0$ to $W_{N-1}$ is described as an analog potential $W_X$. In the constant current circuit 120, any one of the selection signals $S_0$ to $S_{N-1}$ is described as a selection signal $S_X$. In the constant current circuit 120, any one of the digital signals $B_0$ to $B_{N-1}$ is described as a digital signal $B_X$. In the constant current circuit 120, any one of the output currents $OUT_0$ to $OUT_{N-1}$ is described as an output current $OUT_X$.

The transistor 121 has a function of making the output current $OUT_X$, which corresponds to the analog potential $W_X$ held at its gate, flow therethrough. The transistor 122 has a function of controlling the output current $OUT_X$ flowing between a source and a drain of the transistor 121, in response to the digital signal $B_X$. The transistor 123 functions as a switch. The transistor 123 has a function of updating the analog potential $W_X$ at the gate of the transistor 121 by being turned on. The transistor 123 has a function of holding the analog potential $W_X$ supplied to the gate of the transistor 121 by being turned off.

The gate of the transistor 121 is connected to one of a source and a drain of the transistor 123 and one electrode of the capacitor 124. The one of the source and the drain of the transistor 121 is connected to one of a source and a drain of the transistor 122. The other of the source and the drain of the transistor 121 is connected to a fixed potential, e.g., a ground line. A gate of the transistor 122 is connected to a wiring for transmitting the digital signal $B_X$. The other of the source and the drain of the transistor 122 is connected to the side of a wiring connected to the load 130, i.e., a wiring for supplying the output current $OUT_X$. A gate of the transistor 123 is connected to a wiring for transmitting the selection signal $S_X$. The other of the source and the drain of the transistor 123 is connected to a wiring for transmitting the analog potential $W_X$. The other electrode of the capacitor 124 is connected to a fixed potential, e.g., a ground line.

The transistors 121 to 123 included in the constant current circuit 120 in FIG. 1B are each a transistor including an oxide semiconductor in a channel formation region (hereinafter referred to as an OS transistor). In the structure of one embodiment of the present invention, the use of OS transistors as the transistors 121 to 123 enables electric charge corresponding to a desired voltage to be retained in the capacitor by utilizing an extremely low leakage current flowing between a source and a drain when the transistors are off (hereinafter, off-state current). That is, the analog potential supplied once can be held for a long time in a circuit functioning as a memory in the constant current circuit 120. Therefore, an analog potential to be supplied to the power supply circuit 120 does not need to be constantly generated, leading to a reduction in power consumption.

In the semiconductor device 100 including the constant current circuit 120, an analog potential can be corrected by being rewritten when electric charge is stored or released; thus, the analog potential can be corrected substantially indefinitely. In the case where a function of retaining electric charge of the constant current circuit 120 using OS transistors is used for a memory, the constant current circuit 120 has no change in the structure at an atomic level unlike a magnetic memory, a resistive random access memory, or the like, and thus exhibits high rewrite endurance. In addition, unlike in a flash memory, unstableness due to the increase of electron trap centers is not observed in the constant current circuit 120 using OS transistors even when rewrite operation is repeated.

The constant current circuit 120 using OS transistors can be freely placed, for example, over a silicon substrate including a transistor including silicon in a channel formation region (hereinafter, a Si transistor), an element layer including an OS transistor, or the like, so that integration can be easily performed. Furthermore, an OS transistor can be fabricated with a manufacturing apparatus similar to that for a Si transistor and thus can be fabricated at low cost.

An OS transistor can be a four-terminal semiconductor element when having a back gate electrode in addition to a gate electrode, a source electrode, and a drain electrode. The OS transistor can be formed with an electric circuit network that can independently control input and output of signals passing between a source and a drain depending on a voltage supplied to the gate electrode or the back gate electrode. Therefore, the circuit design can be made in a manner similar to that for LSI. Furthermore, the electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed. The OS transistor operates favorably within the range from −40° C. to 190° C. In other words, the OS transistor has a significantly high heat resistance. This heat resistance is higher than the heat resistance of a phase change memory (PCM) (higher than or equal to −40° C. and lower than or equal to 150° C.), the heat resistance of a resistance random access memory (ReRAM) (higher than or equal to −40° C. and lower than or equal to 125° C.), the heat resistance of a magnetoresistive random access memory (MRAM) (higher than or equal to −40° C. and lower than or equal to 105° C.), and the like.

Figure 2A:
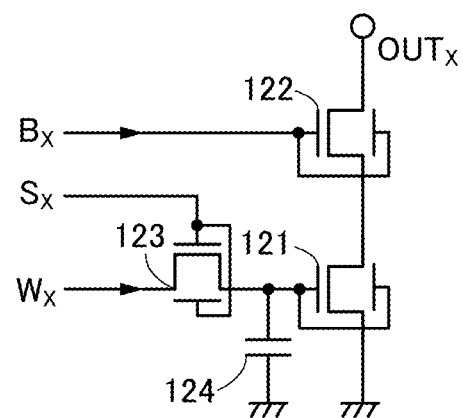
FIG. 2A and FIG. 2B are diagrams for describing configurations of semiconductor devices.
Figure 2B:
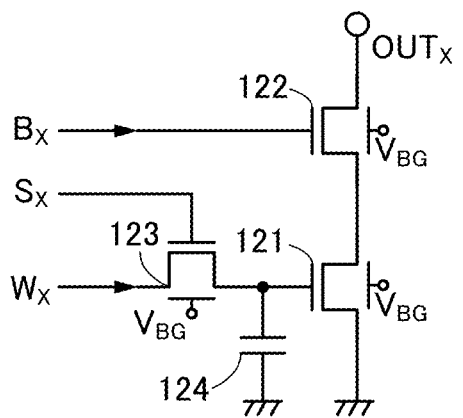

FIG. 2A and FIG. 2B show circuit diagrams for describing modification examples of the constant current circuit 120 illustrated in FIG. 1B.

In FIG. 1B, each transistor is illustrated as a transistor having a top-gate structure or a bottom-gate structure without a back gate electrode; however, the structures of the transistors are not limited thereto. For example, a structure including a back gate electrode connected to a gate electrode may be employed as illustrated in FIG. 2A. With the structure of FIG. 2A, the amount of current flowing through the transistors can be increased.

Alternatively, a structure including a back gate electrode connected to a terminal to which a back gate voltage $V_{BG}$ is applied may be employed as illustrated in FIG. 2B. With the structure of FIG. 2B, electrical characteristics such as the threshold voltages of the transistors can be easily controlled from the outside.

Figure 3A:
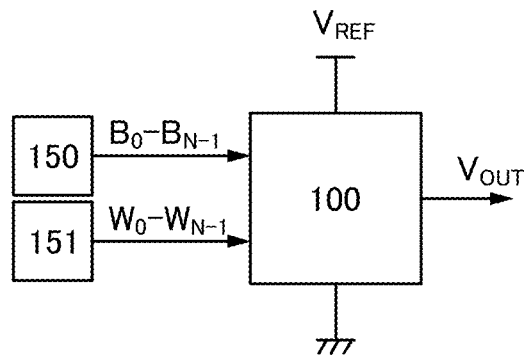
FIG. 3A to FIG. 3C are diagrams for describing configurations of semiconductor devices.

FIG. 3A illustrates a digital signal output circuit 150 that supplies the digital signals $B_0$ to $B_{N-1}$ to the semiconductor device 100 illustrated in FIG. 1A, and a voltage generation circuit 151 that supplies the analog potentials $W_0$ to $W_{N-1}$ to the semiconductor device 100.

As described above, the constant current circuits $120_0$ to $120_{N-1}$ in one embodiment of the present invention are each formed using OS transistors and have a function of holding the analog potentials $W_0$ to $W_{N-1}$. Thus, the voltage generation circuit 151 can be terminated intermittently. Therefore, the power consumption of an electronic device or the like including the semiconductor device 100 can be reduced by termination of the voltage generation circuit 151.

Figure 3B:
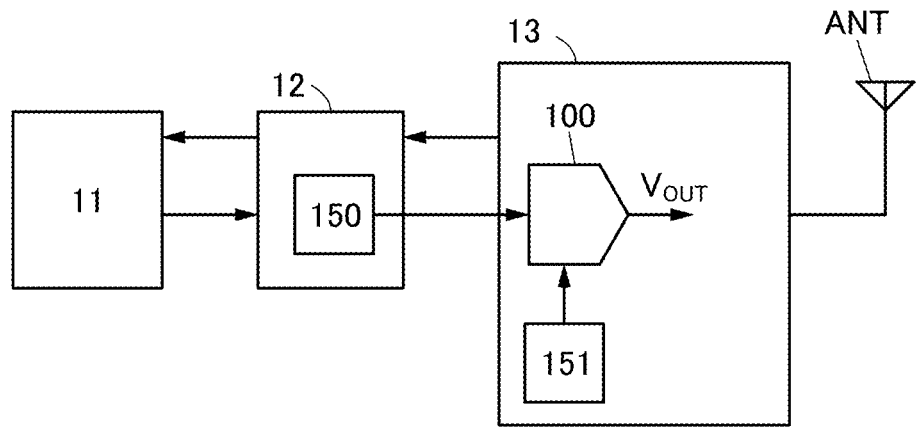

FIG. 3B illustrates part of a block diagram of a wireless communication device which can incorporate the semiconductor device 100. The semiconductor device 100 is provided in an integrated circuit 13 on the analog baseband side in the wireless communication device. The integrated circuit 13 is connected to an antenna ANT and a baseband processor 12 and transmits and receives an analog signal or a digital signal. The baseband processor 12 is connected to an application processor 11 and transmits and receives a digital signal.

As illustrated in FIG. 3B, the voltage generation circuit 151 is provided in the integrated circuit 13 (IC). Although the voltage generation circuit 151 can be provided in the baseband processor 12 including a CMOS circuit, the voltage generation circuit 151 is preferably provided in the integrated circuit 13 so as to reduce the influence of noise, and the like. The digital signal output circuit 150 can be provided in the baseband processor 12.

Figure 3C:
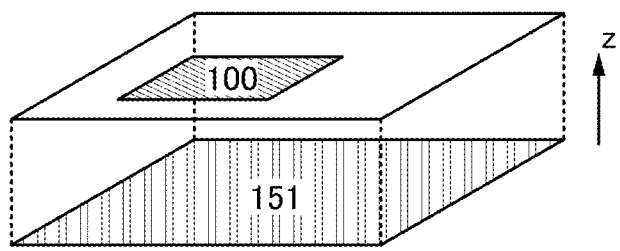

The voltage generation circuit 151 can be formed using Si transistors. The generation circuit 151 is preferably located close to the semiconductor device 100 so that the influence of noise, the influence of wiring resistance, or the like can be reduced. Therefore, the semiconductor device 100 that can be formed using OS transistors and the voltage generation circuit 151 that can be formed using Si transistors are preferably provided so as to overlap each other in the z direction, i.e., the direction substantially perpendicular to the surface of a substrate where the Si transistors are provided, in the integrated circuit 13 as illustrated in FIG. 3C. With such a structure, the influence of a reduction in circuit area and noise, or the like, can be less likely to be caused.

The voltage generation circuit 151 is described as having Si transistors, and in this case, a single crystal substrate of silicon can be provided with the Si transistors. Silicon does not necessarily need to be used, and another semiconductor material such as a compound semiconductor can be used. A material containing Ge (germanium), SiGe (silicon germanium), GaAs (gallium arsenide), GaAlAs (gallium aluminum arsenide), or the like can be used.

In the case where the semiconductor device 100 is stacked over the voltage generation circuit 151, the load 130 and the buffer circuit 140 are also preferably formed using an OS transistor, a resistor, or the like.

Figure 4A:
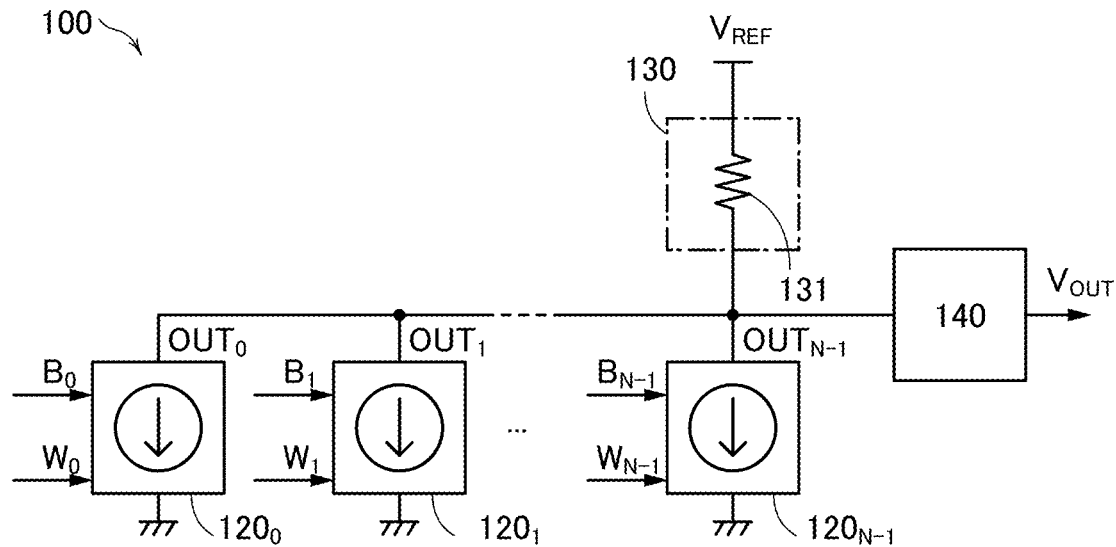
FIG. 4A and FIG. 4B are diagrams for describing configurations of semiconductor devices.
Figure 4B:
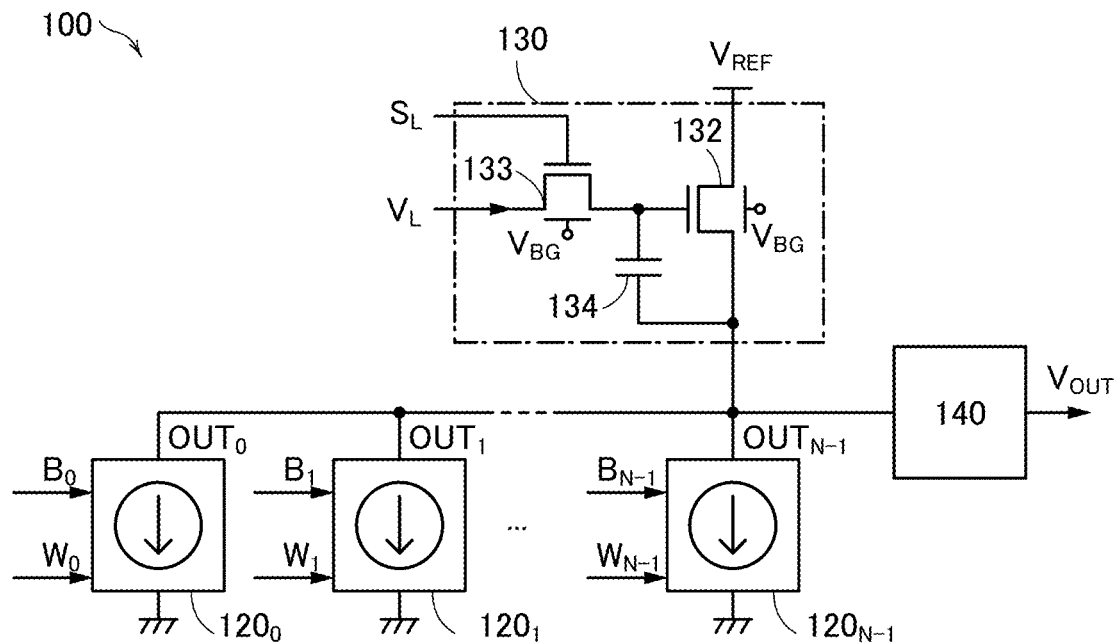

FIG. 4A and FIG. 4B illustrate circuit configuration examples applicable to the load 130. FIG. 4A illustrates a configuration in which a resistor 131 is included in the load 130.

As another example, FIG. 4B shows a diagram in which the load 130 is formed using OS transistors and a capacitor. The load 130 illustrated in FIG. 4B includes a transistor 132, a transistor 133, and a capacitor 134. As an example, a configuration is illustrated in which the transistor 132 and the transistor 133 each have a back gate electrode and the back gate voltage $V_{BG}$ is applied to the back gate electrodes.

In the load 130 illustrated in FIG. 4B, a selection signal $S_L$ is a signal for switching the on/off state of the transistor 133. An analog potential $V_L$ is a potential for setting the potential of a gate of the transistor 132.

The transistor 132 has a function of making a current corresponding to the voltage held in the capacitor 134 flow therethrough. The transistor 133 functions as a switch. The transistor 133 has a function of updating the analog potential $V_L$ at the gate of the transistor 132 by being turned on. The transistor 133 has a function of holding the analog potential $V_L$ supplied to the gate of the transistor 132 by being turned off.

The gate of the transistor 132 is connected to one of a source and a drain of the transistor 133 and one electrode of the capacitor 134. One of a source and a drain of the transistor 132 is connected to a wiring for supplying the voltage $V_{REF}$. The other of the source and the drain of the transistor 132 is connected to the other electrode of the capacitor 134 and the constant current circuits $120_0$ to $120_{N-1}$. A gate of the transistor 133 is connected to a wiring for transmitting the selection signal $S_L$. The other of the source and the drain of the transistor 133 is connected to a wiring for transmitting the analog potential $V_L$.

In FIG. 4B, the transistors 132 and 133 included in the load 130 are OS transistors. In the structure of one embodiment of the present invention, the use of OS transistors as the transistors 132 and 133 enables electric charge corresponding to a desired voltage to be retained in the capacitor 134 by utilizing an extremely low leakage current flowing between a source and a drain when the transistors are off (hereinafter, off-state current). That is, the analog potential supplied once can be held for a long time in a circuit functioning as a memory in the load 130. Therefore, an analog potential to be supplied to the load 130 does not need to be constantly generated, leading to a reduction in power consumption.

Figure 5A:
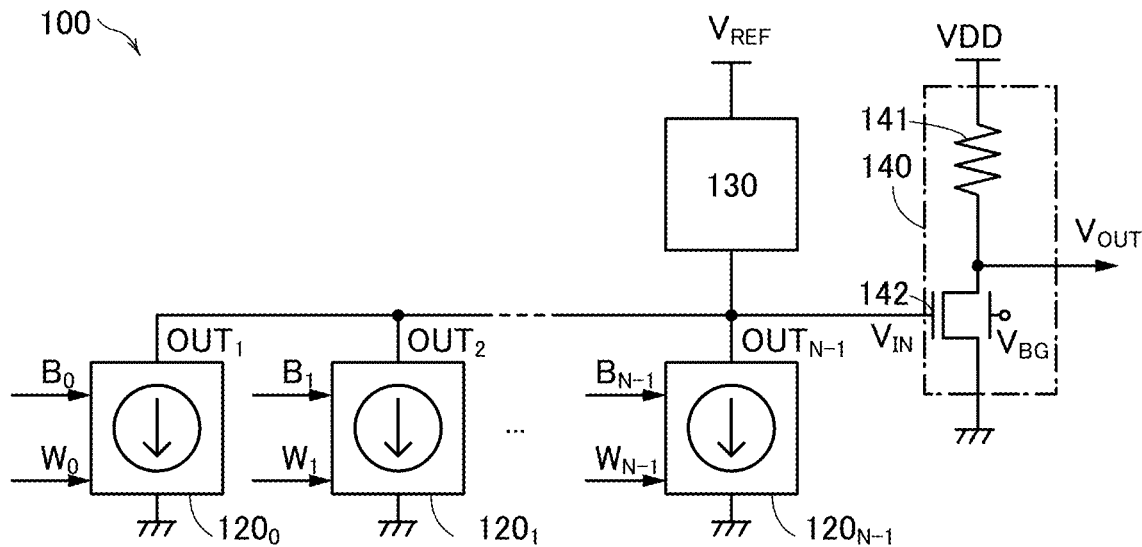
FIG. 5A and FIG. 5B are circuit diagrams for describing configurations of semiconductor devices.
Figure 5B:
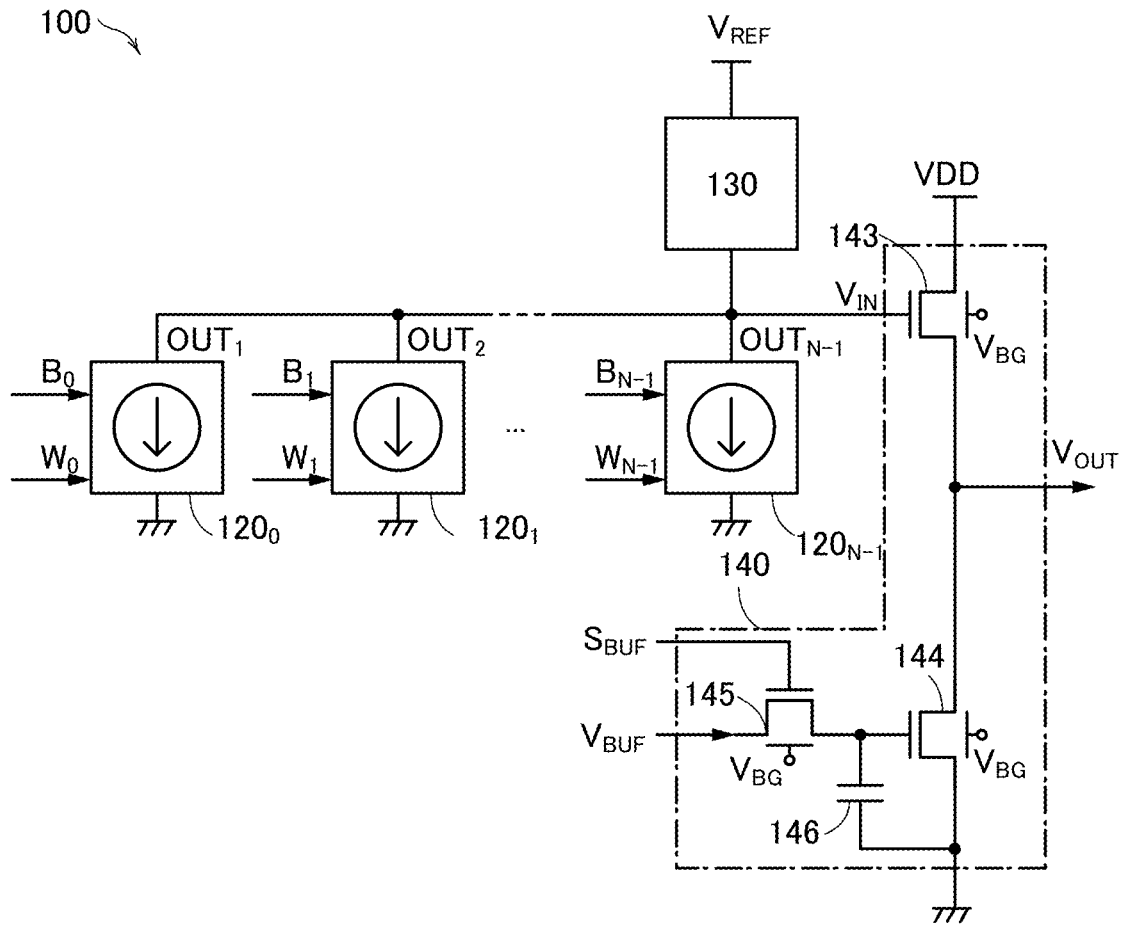

FIG. 5A and FIG. 5B illustrate circuit configuration examples applicable to the buffer circuit 140. FIG. 5A illustrates a configuration in which a resistor 141 and a transistor 142 are included in the buffer circuit 140.

One terminal of the resistor 141 is connected to a wiring for supplying a voltage VDD. The other terminal of the resistor 141 is connected to one of a source and a drain of the transistor 142 and the output terminal $V_{OUT}$. A gate of the transistor 142 is connected to the input terminal $V_{IN}$. The other of the source and the drain of the transistor 142 is connected to a fixed potential, e.g., a ground line. As an example, a configuration is illustrated in which the transistor 142 has a back gate electrode and the back gate voltage $V_{BG}$ is applied to the back gate electrode.

As another example, FIG. 5B shows a diagram in which the buffer circuit 140 is formed using OS transistors and a capacitor. The buffer circuit 140 illustrated in FIG. 5B includes a transistor 143, a transistor 144, a transistor 145, and a capacitor 146. As an example, a configuration is illustrated in which the transistors 143 to 145 each have a back gate electrode and the back gate voltage $V_{BG}$ is applied to the back gate electrodes.

In the buffer circuit 140 illustrated in FIG. 5B, a selection signal $S_{BUF}$ is a signal for switching the on/off state of the transistor 145. An analog potential $V_{BUF}$ is a potential for setting the potential of a gate of the transistor 144.

The gate of the transistor 144 is connected to one of a source and a drain of the transistor 145 and one electrode of the capacitor 146. One of a source and a drain of the transistor 144 is connected to one of a source and a drain of the transistor 143 and the output terminal $V_{OUT}$. The other of the source and the drain of the transistor 144 is connected to a fixed potential, e.g., a ground line, and the other electrode of the capacitor 146. The other of the source and the drain of the transistor 143 is connected to a wiring for supplying the voltage VDD. A gate of the transistor 143 is connected to the input terminal $V_{IN}$. The other of the source and the drain of the transistor 145 is connected to a wiring for supplying the analog potential $V_{BUF}$. A gate of the transistor 145 is connected to a wiring for transmitting the selection signal $S_{BUF}$.

The transistors 143 to 145 included in the buffer circuit 140 in FIG. 5B are OS transistors. In the structure of one embodiment of the present invention, the use of OS transistors as the transistors 143 to 145 enables electric charge corresponding to a desired voltage to be retained in the capacitor 146 by utilizing an extremely low leakage current flowing between a source and a drain when the transistors are off (hereinafter, off-state current). That is, the analog potential supplied once can be held for a long time in a circuit functioning as a memory in the buffer circuit 140. Therefore, an analog potential to be supplied to the buffer circuit 140 does not need to be constantly generated, leading to a reduction in power consumption.

Figure 6A:
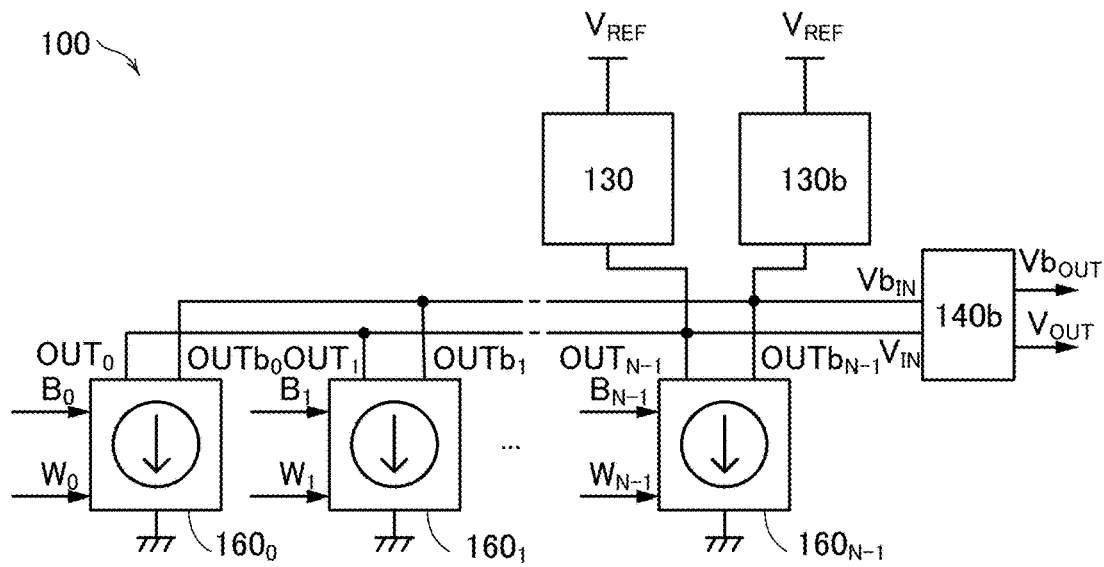
FIG. 6A to FIG. 6C are diagrams for describing a configuration of a semiconductor device.
Figure 6B:
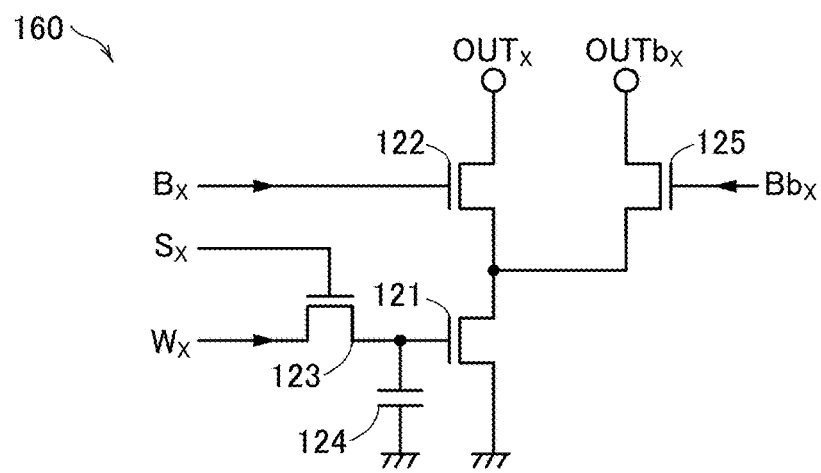

FIG. 6A and FIG. 6B show circuit diagrams for describing a modification example of the constant current circuit 120 illustrated in FIG. 1B.

As a modification example of the constant current circuit 120 that can be applied to FIG. 1A, a differential constant current circuit can be employed. FIG. 6A illustrates a configuration of the semiconductor device 100 in which differential constant current circuits are used. With the use of a differential type, common mode noise can be removed by being canceled.

Differential constant current circuits $160_0$ to $160_{N-1}$ in the semiconductor device 100 illustrated in FIG. 6A are different from the constant current circuits $120_0$ to $120_{N-1}$ in FIG. 1B in that output currents corresponding to respective analog potentials set for the constant current circuits $160_0$ to $160_{N-1}$ are the output currents $OUT_0$ to $OUT_{N-1}$ and output currents $OUTb_0$ to $OUTb_{N-1}$. Inverted signals of the digital signals $B_0$ to $B_{N-1}$ are input to the constant current circuits $160_0$ to $160_{N-1}$. The semiconductor device 100 illustrated in FIG. 6A includes loads 130 and 130b for different current paths, and a buffer circuit 140b.

The load 130b can be formed in a manner similar to that for the load 130.

FIG. 6B is a diagram for describing a configuration example of a constant current circuit 160 that can be used as the constant current circuits $160_0$ to $160_{N-1}$.

The constant current circuit 160 includes a transistor 125 in addition to the transistor 121, the transistor 122, the transistor 123, and the capacitor 124. In the constant current circuit 160, any one of the output currents $OUTb_0$ to $OUTb_{N-1}$ is described as an output current $OUTb_X$. In the constant current circuit 160, any one of inverted signals of the digital signals $B_0$ to $B_{N-1}$ is described as a digital signal $Bb_X$.

The transistor 125 has a function of controlling a current flowing between the source and the drain of the transistor 121 as the output current $OUTb_X$, in response to the digital signal $Bb_X$.

A gate of the transistor 125 is connected to a wiring for transmitting the digital signal $Bb_X$. One of a source and a drain of the transistor 125 is connected to the one of the source and the drain of the transistor 121. The other of the source and the drain of the transistor 125 is connected to the side of a wiring connected to the load 130, i.e., a wiring for supplying the output current $OUT_X$.

The transistors 121 to 123 and the transistor 125 included in the constant current circuit 160 in FIG. 6B are OS transistors. In the structure of one embodiment of the present invention, the use of OS transistors as the transistors 121 to 123 and the transistor 125 enables electric charge corresponding to a desired voltage to be retained in the capacitor 124 by utilizing an extremely low off-state current. That is, the analog potential supplied once can be held for a long time in a circuit functioning as a memory in the constant current circuit 160. Therefore, an analog potential to be supplied to the constant current circuit 160 does not need to be constantly generated, leading to a reduction in power consumption.

Figure 6C:
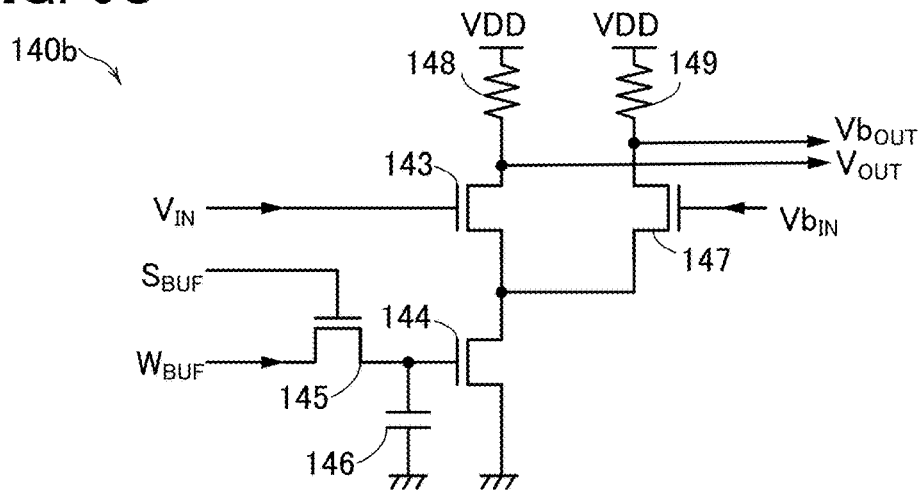

FIG. 6C is a diagram for describing a configuration example of the buffer circuit 140b illustrated in FIG. 6A.

The buffer circuit 140b includes a transistor 147, a resistor 148, and a resistor 149 in addition to the transistors 143 to 145 and the capacitor 146. In the buffer circuit 140b, a pair of input terminals and a pair of output terminals are described as input terminals $V_{IN}$ and $Vb_{IN}$ and output terminals $V_{OUT}$ and $Vb_{OUT}$, respectively.

A gate of the transistor 147 is connected to the input terminal $Vb_{IN}$. One of a source and a drain of the transistor 147 is connected to the one of the source and the drain of the transistor 144. The output terminal $V_{OUT}$ is connected to the resistor 148 connected to a wiring for supplying the voltage VDD and the other of the source and the drain of the transistor 143. The output terminal $Vb_{OUT}$ is connected to the resistor 149 connected to a wiring for supplying the voltage VDD and the other of the source and the drain of the transistor 147.

The transistors 143 to 145 and the transistor 147 included in the buffer circuit 140b in FIG. 6C are OS transistors. In the structure of one embodiment of the present invention, the use of OS transistors as the transistors 143 to 145 and the transistor 147 enables electric charge corresponding to a desired voltage to be retained in the capacitor 146 by utilizing an extremely low off-state current. That is, the analog potential supplied once can be held for a long time in a circuit functioning as a memory in the buffer circuit 140b. Therefore, an analog potential to be supplied to the buffer circuit 140b does not need to be constantly generated, leading to a reduction in power consumption.

In the semiconductor device of one embodiment of the present invention described above, an increase in circuit area is inhibited and power consumption can be reduced.

Embodiment 2

In this embodiment, a structure example of a wireless communication device including an integrated circuit including the semiconductor device 100 described in the above embodiment is described with reference to FIG. 7 and FIG. 8. Although a smartphone is described as an example of the wireless communication device in this embodiment, other wireless communication terminals such as a portable game console, a tablet PC (Personal Computer), and a laptop PC may be used. The wireless communication device of this embodiment can be used as a device that can perform wireless communication.

Figure 7:
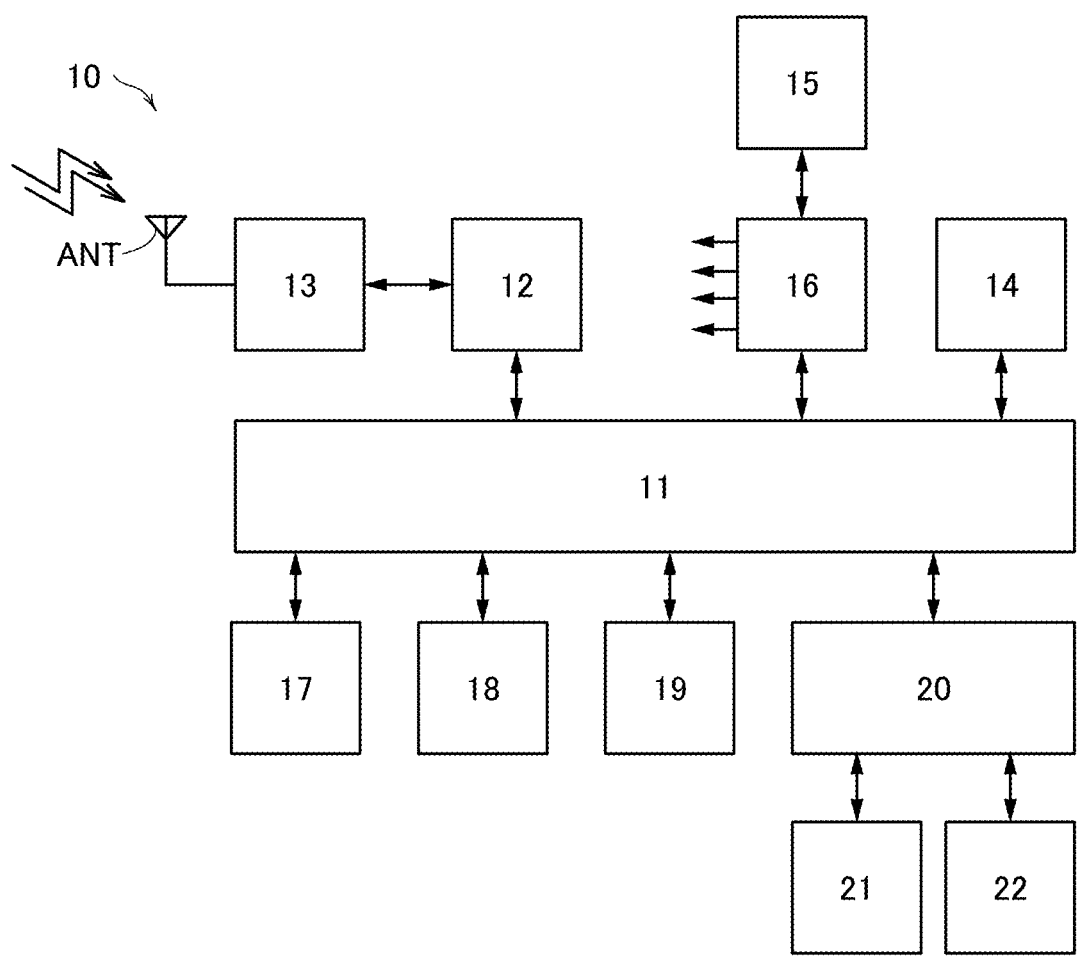
FIG. 7 is a block diagram for describing a structure of a wireless communication device.

A wireless communication device 10 illustrated in a block diagram in FIG. 7 includes an antenna ANT, an application processor 11, a baseband processor 12, an integrated circuit 13 (IC), a memory 14, a battery 15, a power management IC (PMIC) 16, a display portion 17, a camera portion 18, an operation input portion 19, an audio IC 20, a microphone 21, and a speaker 22. Note that the integrated circuit 13 is also referred to as an RF (Radio Frequency) IC or a wireless chip, for example.

A plurality of antennas ANT for a plurality of frequency bands are provided to be compatible with the 5G communication standard.

The application processor 11 has a function of performing processing for fulfilling various functions of the wireless communication device 10 by reading out a program stored in the memory 14. For example, the application processor 11 has a function of executing an OS (Operating System) program from the memory 14 and executing an application program with this OS program as an operating platform.

The baseband processor 12 has a function of performing baseband processing including encoding (e.g., error correction encoding) processing, decoding processing, or the like on data that is transmitted and received by the wireless communication device 10. Specifically, the baseband processor 12 has a function of receiving transmission data from the application processor 11, performing encoding processing on the received transmission data, and transmitting the data to the integrated circuit 13. In addition, the baseband processor 12 has a function of receiving reception data from the integrated circuit 13, performing decoding processing on the received reception data, and transmitting the data to the application processor 11.

The integrated circuit 13 has a function of performing modulation processing or demodulation processing on data that is transmitted and received by the wireless communication device 10. Specifically, the integrated circuit 13 has a function of generating a transmission signal by performing modulation processing using a carrier wave on the transmission data received from the baseband processor 12 and outputting the transmission signal via the antenna ANT. In addition, the integrated circuit 13 has a function of receiving a reception signal via the antenna ANT, generating reception data by performing demodulation processing using a carrier wave on the reception signal, and transmitting the reception data to the baseband processor 12.

The memory 14 has a function of storing a program and data used by the application processor 11. Note that the memory 14 includes a nonvolatile memory that holds stored data even when power supply is interrupted and a volatile memory that loses stored data in the case where power supply is interrupted.

The battery 15 is a battery used when the wireless communication device 10 operates without an external power supply. Note that the wireless communication device 10 can use power from the battery 15 also in the case where an external power supply is connected to the wireless communication device 10. A secondary battery that is rechargeable and dischargeable is preferably used as the battery 15.

The power management IC 16 has a function of generating internal power from the battery 15 or the external power supply. The internal power is supplied to each of the blocks in the wireless communication device 10. At this time, the power management IC 16 has a function of controlling internal power supply voltage for each block to which internal power is supplied. The power management IC 16 controls the internal power supply voltage on the basis of an instruction from the application processor 11. In addition, the power management IC 16 can control supply and interrupt of supply of internal power block by block. The power management IC 16 also has a function of controlling charging of the battery 15 in the case where power is supplied from the external power supply.

The display portion 17 is a liquid crystal display device or a light-emitting display device and has a function of displaying various images in response to processing in the application processor 11. Images to be displayed on the display portion 17 include a user interface image with which a user gives an operation instruction to the wireless communication device 10, a camera image, a moving image, and the like.

The camera portion 18 has a function of acquiring an image in accordance with the instruction from the application processor 11. The operation input portion 19 has a function of a user interface that a user operates to give an operation instruction to the wireless communication device 10. The audio IC 20 has a function of driving the speaker 22 by decoding audio data transmitted from the application processor 11. In addition, the audio IC 20 has a function of generating audio data by encoding audio information obtained by the microphone 21 and outputting the audio data to the application processor 11.

Figure 8:
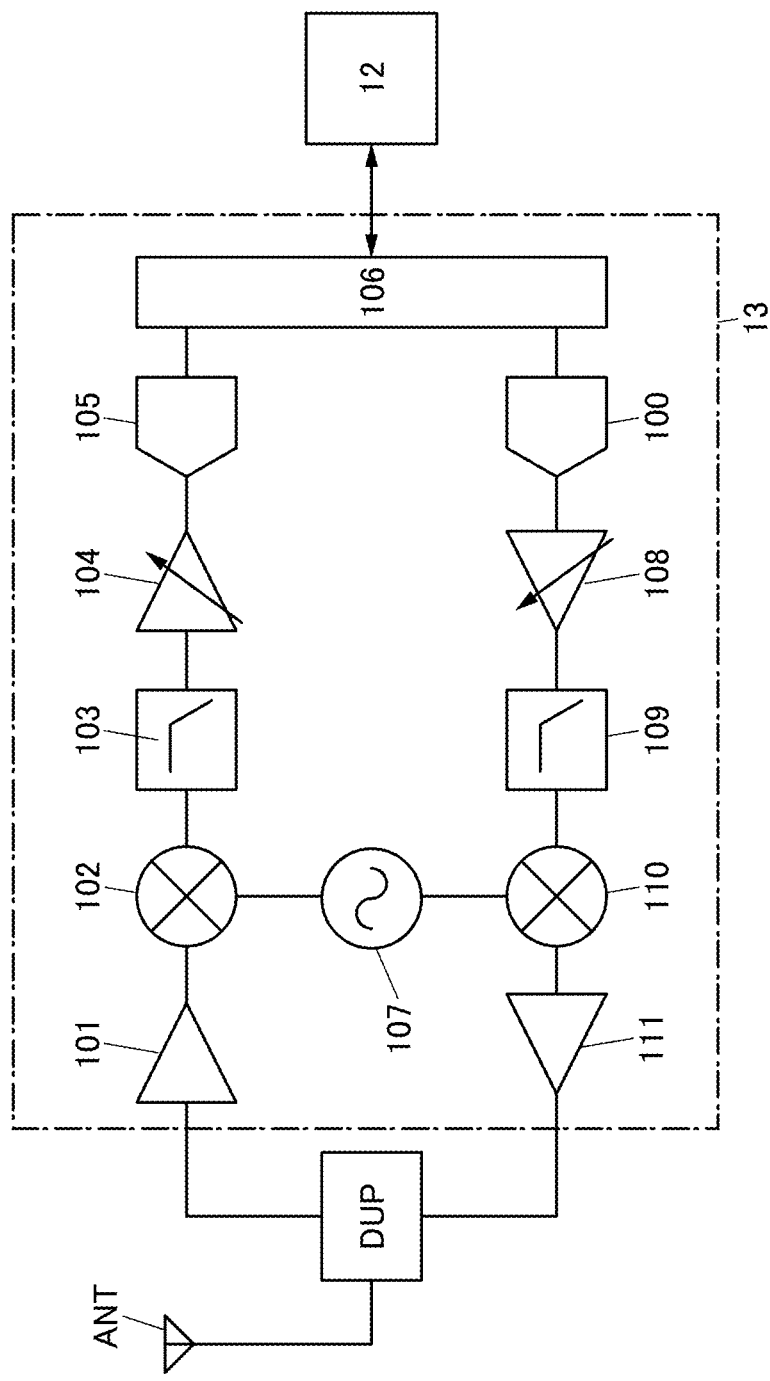
FIG. 8 is a block diagram for describing a structure of a wireless communication device.

FIG. 8 is a block diagram illustrating a structure example of the integrated circuit 13. The integrated circuit 13 illustrated in FIG. 8 includes a low noise amplifier 101, a mixer 102, a low-pass filter 103, a variable gain amplifier 104, an analog-to-digital converter circuit 105, an interface portion 106, the semiconductor device 100 functioning as a DAC, a variable gain amplifier 108, a low-pass filter 109, a mixer 110, a power amplifier 111, and an oscillation circuit 107. FIG. 8 also illustrates the antenna ANT, a duplexer DUP, and the baseband processor 12. Note that the low noise amplifier 101, the mixer 102, the low-pass filter 103, the variable gain amplifier 104, and the analog-to-digital converter circuit 105 may be referred to as a receiving circuit block, and the semiconductor device 100 functioning as a DAC, the variable gain amplifier 108, the low-pass filter 109, the mixer 110, and the power amplifier 111 may be referred to as a transmitting circuit block.

Note that the baseband processor 12 and the integrated circuit 13 are formed of separate semiconductor chips. The duplexer DUP includes an antenna switch and the like.

The low noise amplifier 101 amplifies a signal received by the antenna ANT with low noise. The mixer 102 performs demodulation and downconversion (frequency conversion) using a signal of the semiconductor device 100 functioning as a DAC. The low-pass filter 103 removes an unnecessary high-frequency component from a signal from the mixer 102. The variable gain amplifier 104 amplifies an output signal from the low-pass filter 103 with a gain taking the input range of the analog-to-digital converter circuit 105 into account. The analog-to-digital converter circuit 105 converts the analog signal from the variable gain amplifier 104 into a digital signal. The digital signal is output to the baseband processor 12 via the interface portion 106 and a differential interface circuit.

The semiconductor device 100 functioning as a DAC converts the digital signal received by the interface portion 106 into an analog signal. The variable gain amplifier 108 amplifies an output signal from the semiconductor device 100 functioning as a DAC. The low-pass filter 109 removes an unnecessary high-frequency component from a signal from the variable gain amplifier 108. The mixer 110 performs modulation and upconversion (frequency conversion) of an analog signal with the use of a signal of the oscillation circuit 107. The power amplifier 111 amplifies an output signal from the mixer 110 with a predetermined gain and outputs the signal.

The composition, structure, method, and the like described in this embodiment can be used in combination as appropriate with the compositions, structures, methods, and the like described in the other embodiments and the like.

Embodiment 3

In this embodiment, structures of transistors that can be used in the semiconductor device described in the above embodiment will be described. As an example, a configuration in which transistors having different electrical characteristics are stacked will be described. With the configuration, the degree of freedom in design of the semiconductor device can be increased. Stacking transistors having different electrical characteristics can increase the degree of integration of the semiconductor device.

Figure 9:
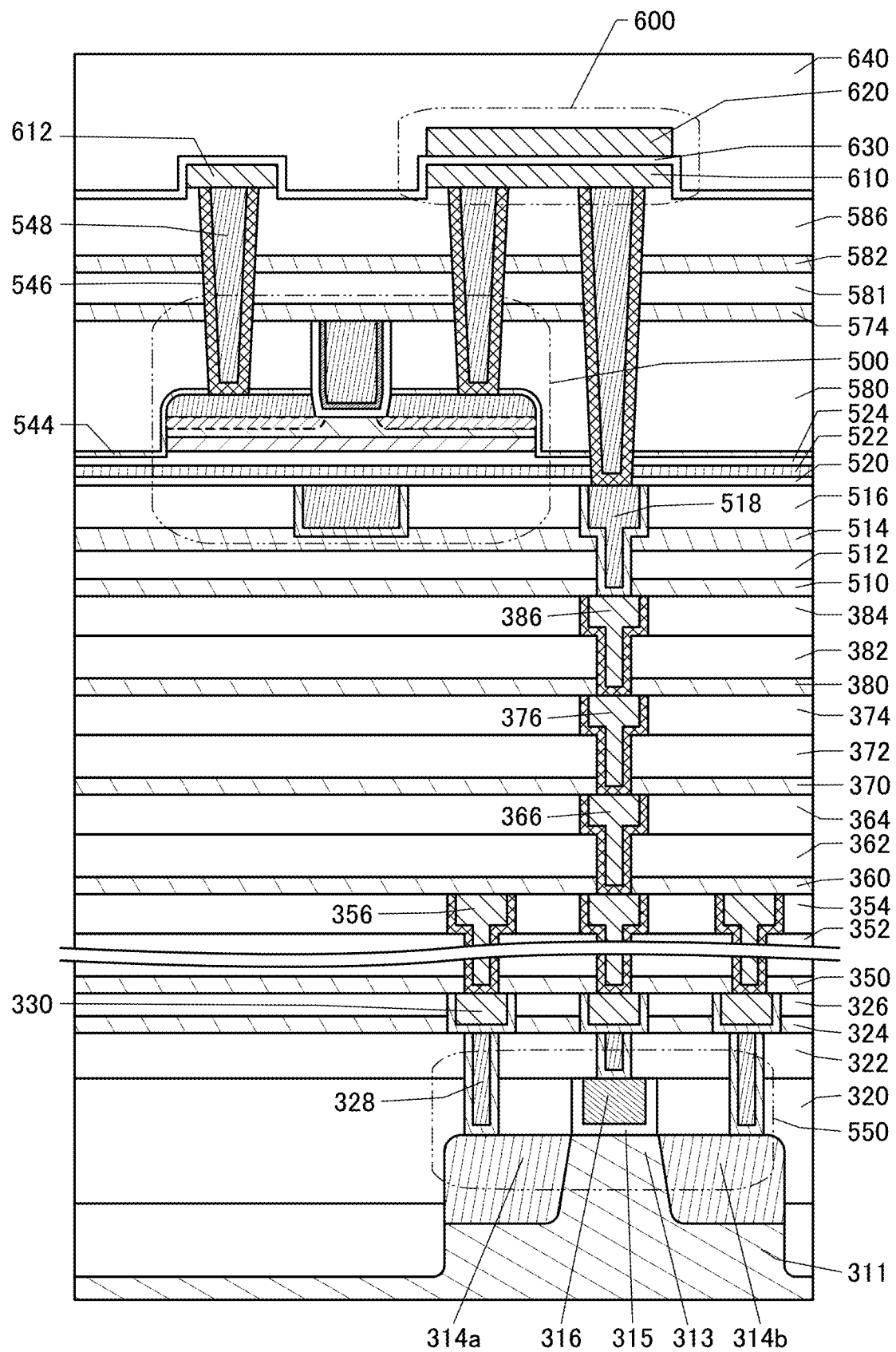
FIG. 9 is a diagram showing a structure example of a semiconductor device.
Figure 11A:
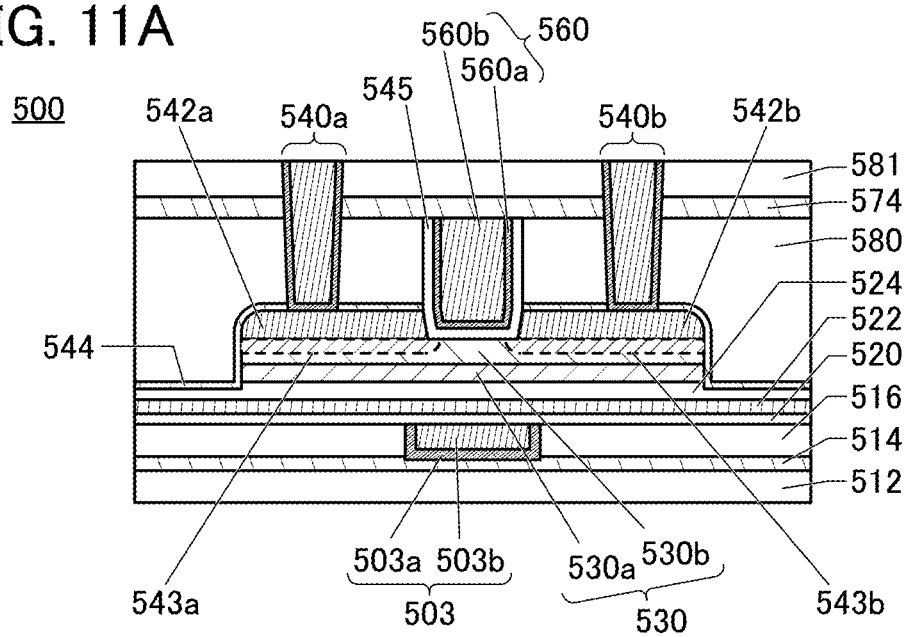
FIG. 11A to FIG. 11C are diagrams showing structure examples of transistors.
Figure 11B:
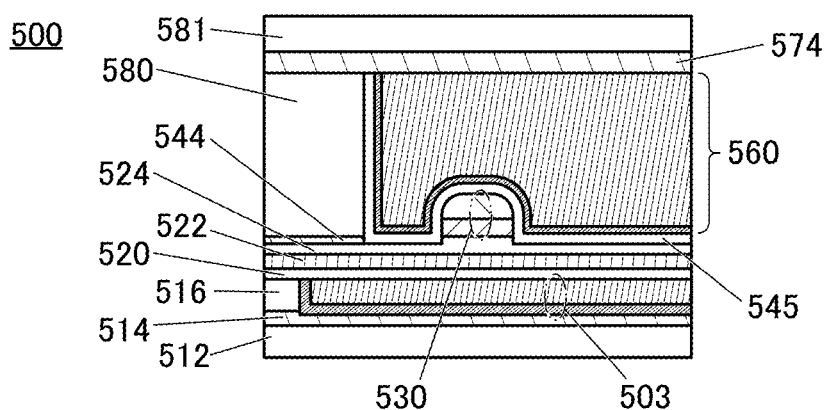
Figure 11C:
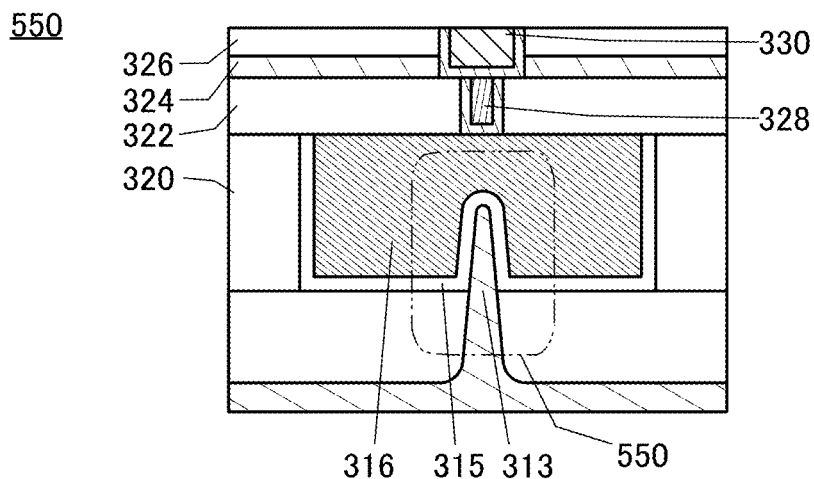

FIG. 9 shows part of a cross-sectional structure of a semiconductor device. A semiconductor device shown in FIG. 9 includes a transistor 550, a transistor 500, and a capacitor 600. FIG. 11A is a cross-sectional view of the transistor 500 in the channel length direction, FIG. 11B is a cross-sectional view of the transistor 500 in the channel width direction, and FIG. 11C is a cross-sectional view of the transistor 550 in the channel width direction. For example, the transistor 500 corresponds to an OS transistor such as the transistor 121 described in the above embodiment, and the transistor 550 corresponds to a Si transistor such as a transistor included in the voltage generation circuit 151.

The transistor 500 is an OS transistor.

In FIG. 9, the transistor 500 is provided above the transistor 550, and the capacitor 600 is provided above the transistor 550 and the transistor 500.

The transistor 550 is provided over a substrate 311 and includes a conductor 316, an insulator 315, a semiconductor region 313 that is part of the substrate 311, and a low-resistance region 314a and a low-resistance region 314b functioning as a source region and a drain region.

As shown in FIG. 11C, in the transistor 550, the top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice to change the lattice spacing is used. Alternatively, the transistor 550 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing an element which imparts n-type conductivity, such as arsenic or phosphorus, or an element which imparts p-type conductivity, such as boron, or a conductive material such as a metal material, an alloy material, or a metal oxide material can be used.

Note that since the work function of a conductor depends on a material of the conductor, the threshold voltage of the transistor can be adjusted by selecting a material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (Silicon on Insulator) substrate, for example.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature heating, or an SOI substrate formed by a Smart-Cut method in which a semiconductor substrate is cleaved by utilizing growth of a minute void, which is formed by implantation of a hydrogen ion, by thermal treatment; an ELTRAN method (registered trademark: Epitaxial Layer Transfer); or the like. A transistor formed using a single crystal substrate contains a single crystal semiconductor in a channel formation region.

Figure 10:
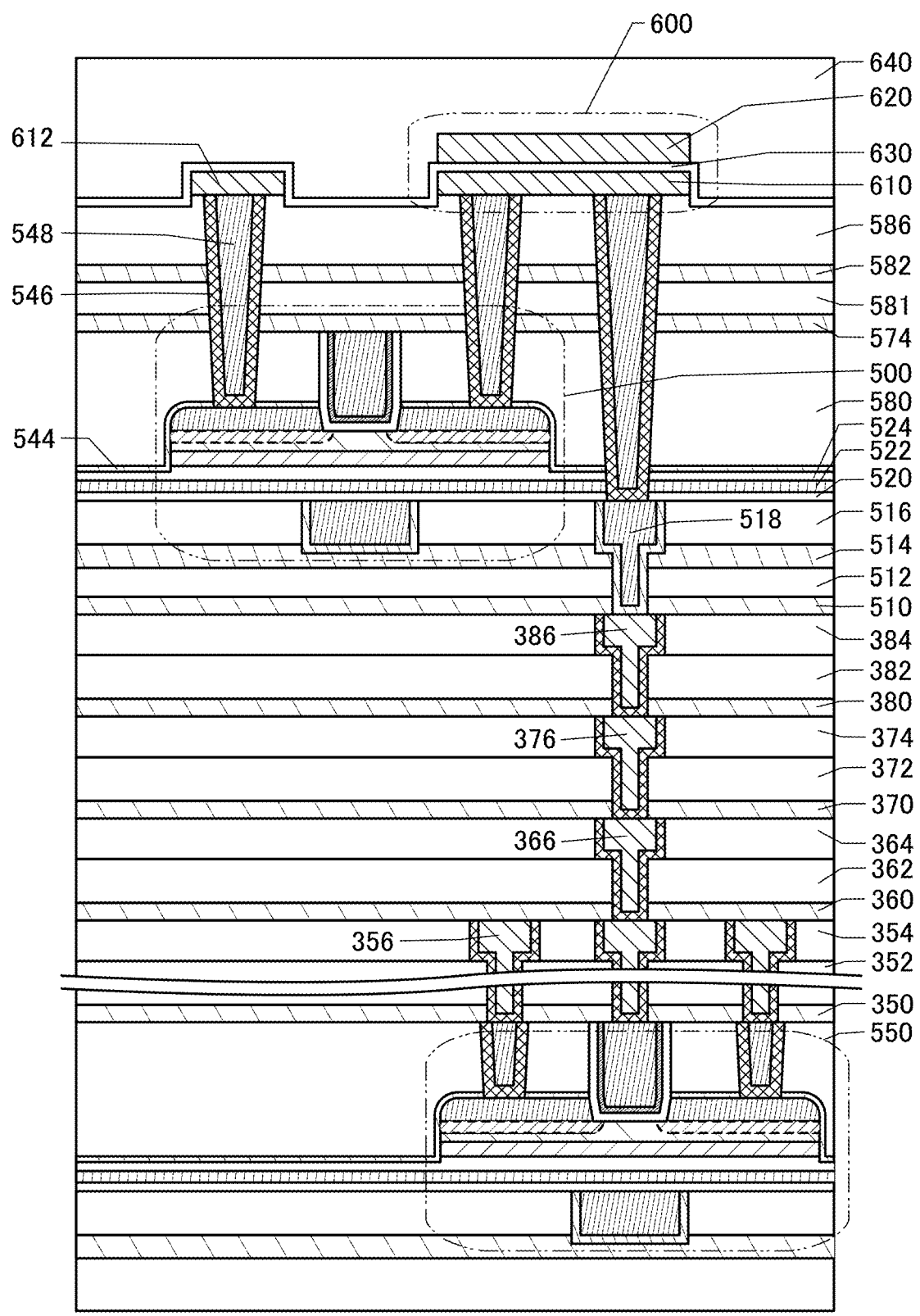
FIG. 10 is a diagram showing a structure example of a semiconductor device.

Note that the transistor 550 shown in FIG. 9 is an example and the structure is not limited thereto; an appropriate transistor can be used in accordance with a circuit configuration or a driving method. For example, when the semiconductor device is a single-polarity circuit using only OS transistors (which represent transistors having the same polarity, e.g., only n-channel transistors), the transistor 550 has a structure similar to that of the transistor 500 as illustrated in FIG. 10. Note that the details of the transistor 500 will be described later.

An insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, the top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen and impurities from the substrate 311, the transistor 550, or the like into a region where the transistor 500 is provided.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range from 50° C. to 500° C., for example.

Note that the dielectric constant of the insulator 326 is preferably lower than that of the insulator 324. For example, the relative dielectric constant of the insulator 326 is preferably lower than 4, further preferably lower than 3. The relative dielectric constant of the insulator 326 is, for example, preferably 0.7 times or less, further preferably 0.6 times or less the relative dielectric constant of the insulator 324. When a material with a low dielectric constant is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are a case where part of a conductor functions as a wiring and a case where part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 9, an insulator 350, an insulator 352, and an insulator 354 are provided so as to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, as the insulator 350, an insulator having a barrier property against hydrogen is preferably used as in the case of the insulator 324. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity of a wiring is kept. In that case, a configuration in which a tantalum nitride layer having a barrier property against hydrogen is in contact with the insulator 350 having a barrier property against hydrogen is preferable.

A wiring layer may be provided over the insulator 354 and the conductor 356. For example, in FIG. 9, an insulator 360, an insulator 362, and an insulator 364 are provided so as to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, an insulator having a barrier property against hydrogen is preferably used as in the case of the insulator 324. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 9, an insulator 370, an insulator 372, and an insulator 374 are provided so as to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, an insulator having a barrier property against hydrogen is preferably used as in the case of the insulator 324. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 9, an insulator 380, an insulator 382, and an insulator 384 are provided so as to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, an insulator having a barrier property against hydrogen is preferably used as in the case of the insulator 324. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers that are similar to the wiring layer including the conductor 356 may be three or less, or the number of wiring layers that are similar to the wiring layer including the conductor 356 may be five or more.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen and impurities from the substrate 311, a region where the transistor 550 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 550. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in the electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a relatively low dielectric constant is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As shown in FIG. 11A and FIG. 11B, the transistor 500 includes the conductor 503 positioned so as to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening overlapping with a region between the conductor 542a and the conductor 542b; an insulator 545 positioned on the bottom surface and a side surface of the opening; and a conductor 560 positioned on a formation surface of the insulator 545.

As illustrated in FIG. 11A and FIG. 11B, an insulator 544 is preferably positioned between the insulator 580 and the oxide 530a, the oxide 530b, the conductor 542a, and the conductor 542b. Furthermore, as shown in FIG. 11A and FIG. 11B, the conductor 560 preferably includes a conductor 560a provided on the inner side of the insulator 545 and a conductor 560b provided so as to be embedded on the inner side of the conductor 560a. Moreover, as shown in FIG. 11A and FIG. 11B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is shown, the present invention is not limited thereto. For example, a structure may be employed in which a single layer of the oxide 530b or a stacked-layer structure of three or more layers is provided.

Furthermore, although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 illustrated in FIG. 9, FIG. 10, and FIG. 11A is an example and the structure is not limited thereto; an appropriate transistor is used in accordance with a circuit structure, a driving method, or the like.

Here, the conductor 560 functions as a gate electrode of the transistor, and the conductor 542a and the conductor 542b function as a source electrode and a drain electrode. As described above, the conductor 560 is formed so as to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned so as to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. Furthermore, in this specification and the like, the surrounded channel (S-channel) structure has a feature in which the side surface and the vicinity of the oxide 530 that is in contact with the conductor 542a and the conductor 542b functioning as a source electrode and a drain electrode are of I-type like the channel formation region. Since the side surface and the vicinity of the oxide 530 that is in contact with the conductor 542a and the conductor 542b are in contact with the insulator 544, they can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or so as to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in the conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although a stacked layer of the conductor 503a and the conductor 503b is shown as the conductor 503 in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the film by heating. In this specification and the like, oxygen released by heating is sometimes referred to as "excess oxygen". That is, a region containing excess oxygen (also referred to as an excess-oxygen region) is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor using an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_OH$ is sufficiently reduced. When an oxide semiconductor with sufficiently reduced impurities such as $V_OH$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \rightarrow V_O + H$" occurs. Part of hydrogen generated at this time is bonded to oxygen to be $H_2O$, and removed from the oxide 530 or an insulator near the oxide 530 in some cases. Some hydrogen may be gettered into the conductor 542a and the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O+O\rightarrow$null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (oxygen is unlikely to pass through the insulator 522).

When the insulator 522 has a function of inhibiting diffusion of oxygen and impurities, oxygen contained in the oxide 530 is not diffused to the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, when an insulator that is a high-k material is combined with silicon oxide or silicon oxynitride, the insulator 520 having a stacked-layer structure that has thermal stability and a high relative dielectric constant can be obtained.

Note that in the transistor 500 in FIG. 11A and FIG. 11B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, a stacked-layer structure formed of the same material does not necessarily need to be employed, and a stacked-layer structure formed of different materials may be employed.

In the transistor 500, a metal oxide functioning as an oxide semiconductor is used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. For example, a metal oxide containing indium, zinc, and gallium (In—Ga—Zn-based oxide), a metal oxide containing indium, zinc, and tin (In—Sn—Zn-based oxide), a metal oxide containing indium, zinc, gallium, and tin (In—Ga—Zn—Sn-based oxide), or the like can be favorably used.

The metal oxide functioning as an oxide semiconductor can be formed by a sputtering method or an ALD (Atomic Layer Deposition) method. Note that the metal oxide functioning as an oxide semiconductor will be described in detail in another embodiment.

The metal oxide functioning as the channel formation region in the oxide 530, which has a band gap of 2 eV or higher, preferably 2.5 eV or higher, is preferably used. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxides that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion of the oxide 530a and the oxide 530b. In other words, the energy level of the conduction band minimum at the junction portion of the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is used as the oxide 530a.

At this time, the oxide 530b serves as a main carrier path. When the oxide 530a has the above-described structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 11, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where an aluminum film or a copper film is stacked over the titanium film or the titanium nitride film and a titanium film or a titanium nitride film is formed over the aluminum film or the copper film; and a three-layer structure where an aluminum film or a copper film is stacked over the molybdenum film or the molybdenum nitride film and a molybdenum film or a molybdenum nitride film is formed over the aluminum film or the copper film. Note that a transparent conductive material containing indium oxide, tin oxide, or zinc oxide may be used.

In addition, as shown in FIG. 11A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided so as to cover the conductor 542a and the conductor 542b and inhibits oxidation of the conductor 542a and the conductor 542b. At this time, the insulator 544 may be provided such that it covers a side surface of the oxide 530 and is in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 can be used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative dielectric constant.

Although the conductor 560 that functions as the first gate electrode and has a two-layer structure is shown in FIG. 11A and FIG. 11B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in the conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used for the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed so as to be embedded in the opening of the insulator 580 and the region between the conductor 542a and the conductor 542b.

The gate length needs to be short for miniaturization of the semiconductor device, but it is necessary to prevent a reduction in the conductivity of the conductor 560. When the conductor 560 is made thick to achieve this, the conductor 560 might have a shape with a high aspect ratio. In this embodiment, the conductor 560 is provided so as to be embedded in the opening of the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 545. When the insulator 574 is deposited by a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the film is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in the electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a relatively low dielectric constant is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed so as to surround the transistor 500 and an insulator having a high barrier property against hydrogen or water may be formed so as to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed so as to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided so as to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and a SOI (Silicon on Insulator) substrate. Alternatively, a plastic substrate having heat resistance to the processing temperature in this embodiment may be used. Examples of a glass substrate include barium borosilicate glass, aluminosilicate glass, aluminoborosilicate glass, and soda lime glass. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stacked-layer structure of a tungsten film and a silicon oxide film, which are inorganic films, a structure in which an organic resin film of polyimide or the like is formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Modification Example 1 of Transistor

Figure 12A:
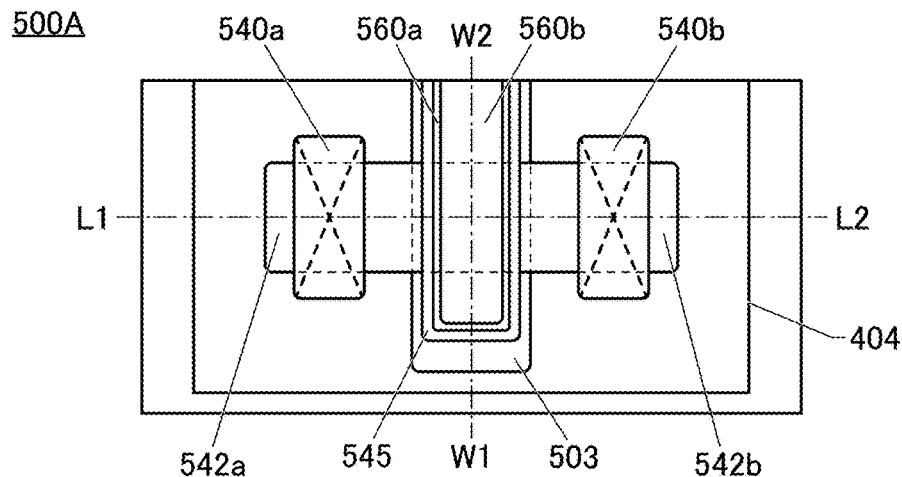
FIG. 12A to FIG. 12C are diagrams showing a structure example of a transistor.
Figure 12B:
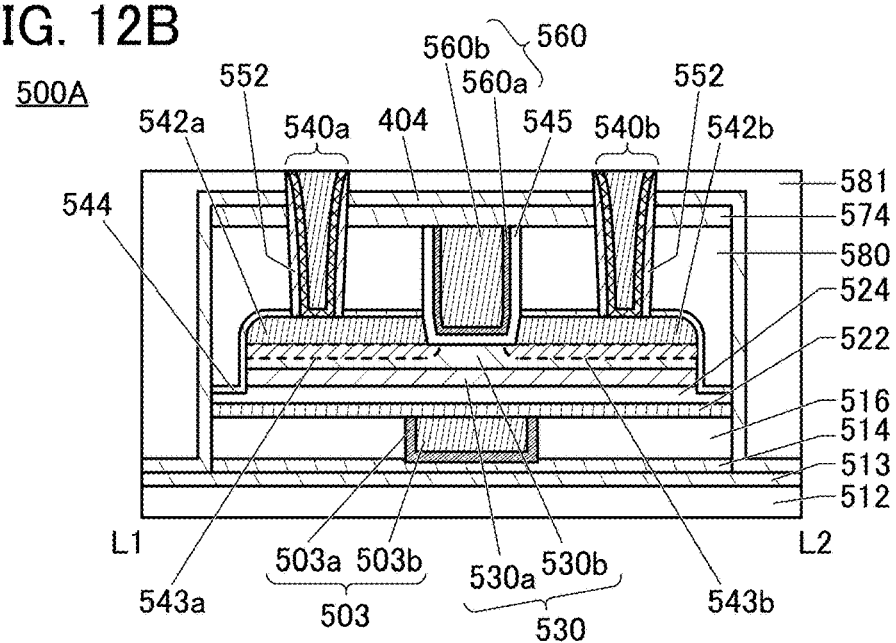
Figure 12C:
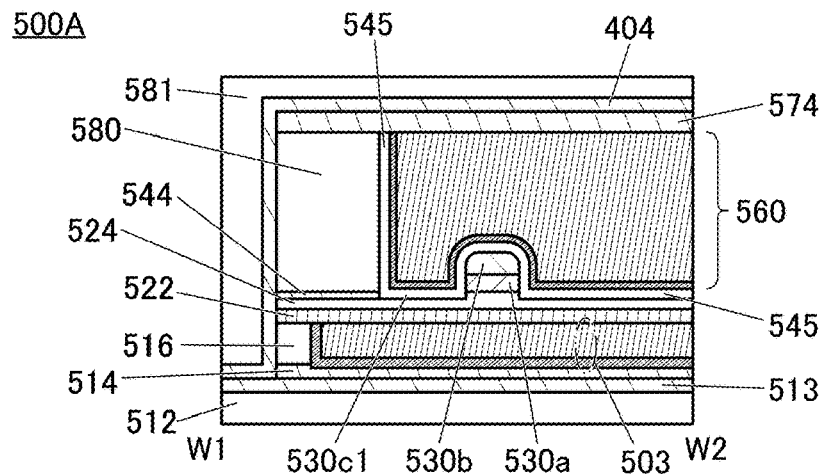

A transistor 500A illustrated in FIG. 12A, FIG. 12B, and FIG. 12C is a modification example of the transistor 500 having the structure shown in FIG. 11A and FIG. 11B. FIG. 12A is a top view of the transistor 500A. FIG. 12B is a cross-sectional view of the transistor 500A in the channel length direction, which is taken along the dashed-dotted line (L1-L2) in FIG. 12A, and FIG. 12C is a cross-sectional view of the transistor 500A in the channel width direction, which is taken along the dashed-dotted line (W1-W2) in FIG. 12B. Note that the structure shown in FIG. 12A, FIG. 12B, and FIG. 12C can also be used for other transistors, such as the transistor 550, included in the semiconductor device of one embodiment of the present invention.

The transistor 500A having the structure illustrated in FIG. 12A, FIG. 12B, and FIG. 12C is different from the transistor 500 having the structure illustrated in FIG. 11A and FIG. 11B in that an insulator 552, an insulator 513, and an insulator 404 are included. Furthermore, the transistor 500A having the structure shown in FIG. 12A, FIG. 12B, and FIG. 12C is different from the transistor 500 having the structure shown in FIG. 11A and FIG. 11B in that the insulator 552 is provided in contact with a side surface of the conductor 540a and a side surface of the conductor 540b. Moreover, the transistor 500A having the structure shown in FIG. 12A, FIG. 12B, and FIG. 12C is different from the transistor 500 having the structure shown in FIG. 11A and FIG. 11B in that the insulator 520 is not included.

In the transistor 500A having the structure shown in FIG. 12A, FIG. 12B, and FIG. 12C, the insulator 513 is provided over the insulator 512. The insulator 404 is provided over the insulator 574 and the insulator 513.

In the transistor 500A having the structure shown in FIG. 12A, FIG. 12B, and FIG. 12C, the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and the top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide, each of which is a material having a high hydrogen barrier property, is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide, each of which is a material having a high hydrogen barrier property, is preferably used. In particular, it is preferable to use silicon nitride for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Modification Example 2 of Transistor

Figure 13A:
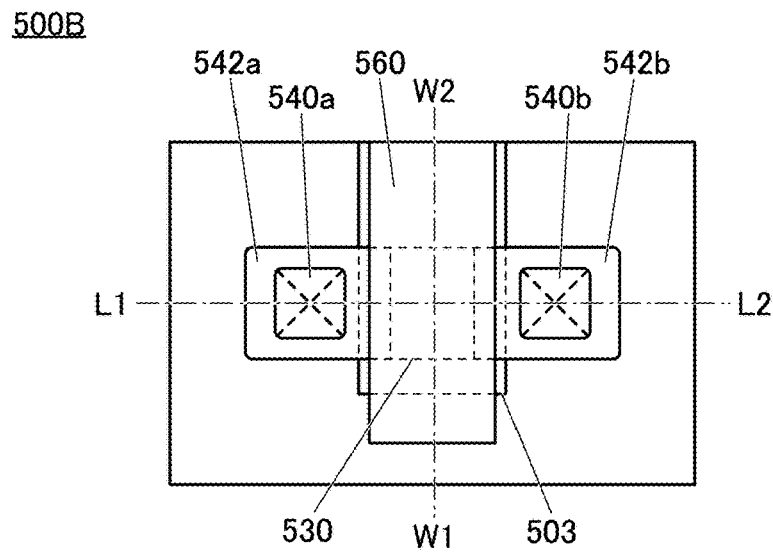
FIG. 13A to FIG. 13C are diagrams showing a structure example of a transistor.
Figure 13B:
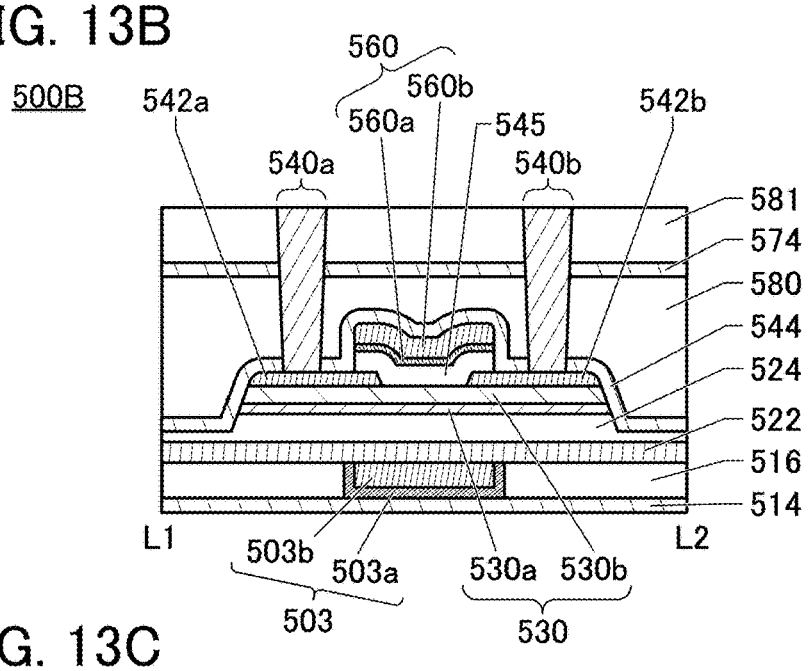
Figure 13C:
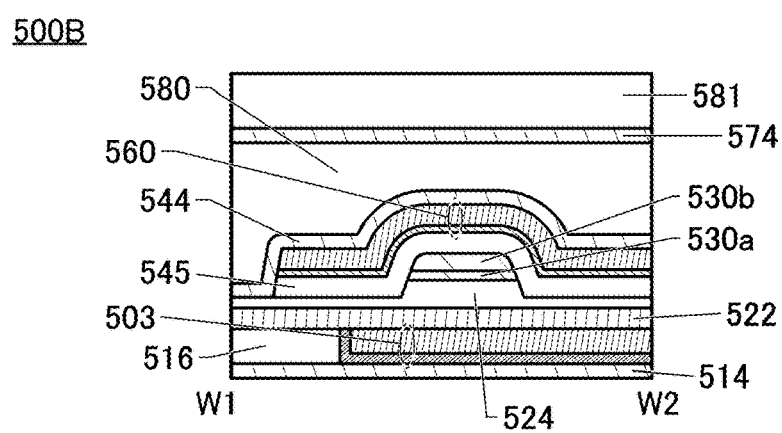

A structure example of a transistor 500B will be described with reference to FIG. 13A, FIG. 13B, and FIG. 13C. FIG. 13A is a top view of the transistor 500B. FIG. 13B is a cross-sectional view of a portion indicated by dashed-dotted line L1-L2 in FIG. 13A. FIG. 13C is a cross-sectional view of a portion indicated by a dashed-dotted line W1-W2 in FIG. 13A. Note that for clarity of the drawing, some components are not shown in the top view of FIG. 13A.

The transistor 500B is a modification example of the transistor 500 and can be replaced with the transistor 500. Therefore, differences of the transistor 500B from the transistor 500 will be mainly described to avoid repeated description.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be extended. That is, the conductor 560a inhibits oxidation of the conductor 560b, thereby preventing a decrease in conductivity.

The insulator 544 is preferably provided so as to cover the top surface and the side surface of the conductor 560 and a side surface of the insulator 545. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in combination as appropriate with the compositions, structures, methods, and the like described in the other embodiments and the like.

Embodiment 4

In this embodiment, an oxide semiconductor which is a kind of metal oxides will be described.

The metal oxide preferably contains at least indium or zinc. In particular, indium and zinc are preferably contained. In addition, aluminum, gallium, yttrium, tin, or the like is preferably contained. Furthermore, one kind or two or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, classifications of the crystal structures of an oxide semiconductor will be described with reference to FIG. 14A. FIG. 14A is a diagram showing classifications of crystal structures of an oxide semiconductor, typically IGZO (metal oxide containing In, Ga, and Zn).

As shown in FIG. 14A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 14A are in an intermediate state between "Amorphous" and "Crystal", and belong to a new boundary region (new crystalline phase). That is, these structures are completely different from "Amorphous", which is energetically unstable, and "Crystal".

A crystal structure of a film or a substrate can be analyzed with an X-ray diffraction (XRD) spectrum. Here, FIG. 14B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 14B and obtained by GIXD measurement is hereinafter simply referred to as an XRD spectrum. The CAAC-IGZO film shown in FIG. 14B has a composition in the neighborhood of In:Ga:Zn=4:2:3 [atomic ratio]. The CAAC-IGZO film shown in FIG. 14B has a thickness of 500 nm.

As shown in FIG. 14B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 14B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 14C shows a diffraction pattern of the CAAC-IGZO film. FIG. 14C shows a diffraction pattern obtained with NBED in which an electron beam is incident in the direction parallel to the substrate. The CAAC-IGZO film in FIG. 14C has a composition in the neighborhood of In:Ga:Zn=4:2:3 [atomic ratio]. In the nanobeam electron diffraction method, electron diffraction is performed with a probe diameter of 1 nm.

As shown in FIG. 14C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 14A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one kind or two or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable.

Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. The CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be fabricated.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described in this embodiment can be used in combination as appropriate with the compositions, structures, methods, and the like described in the other embodiments and the like.

Embodiment 5

In this embodiment, application examples of the above-described semiconductor device will be described.

[Semiconductor Wafer and Chip]

Figure 15A:
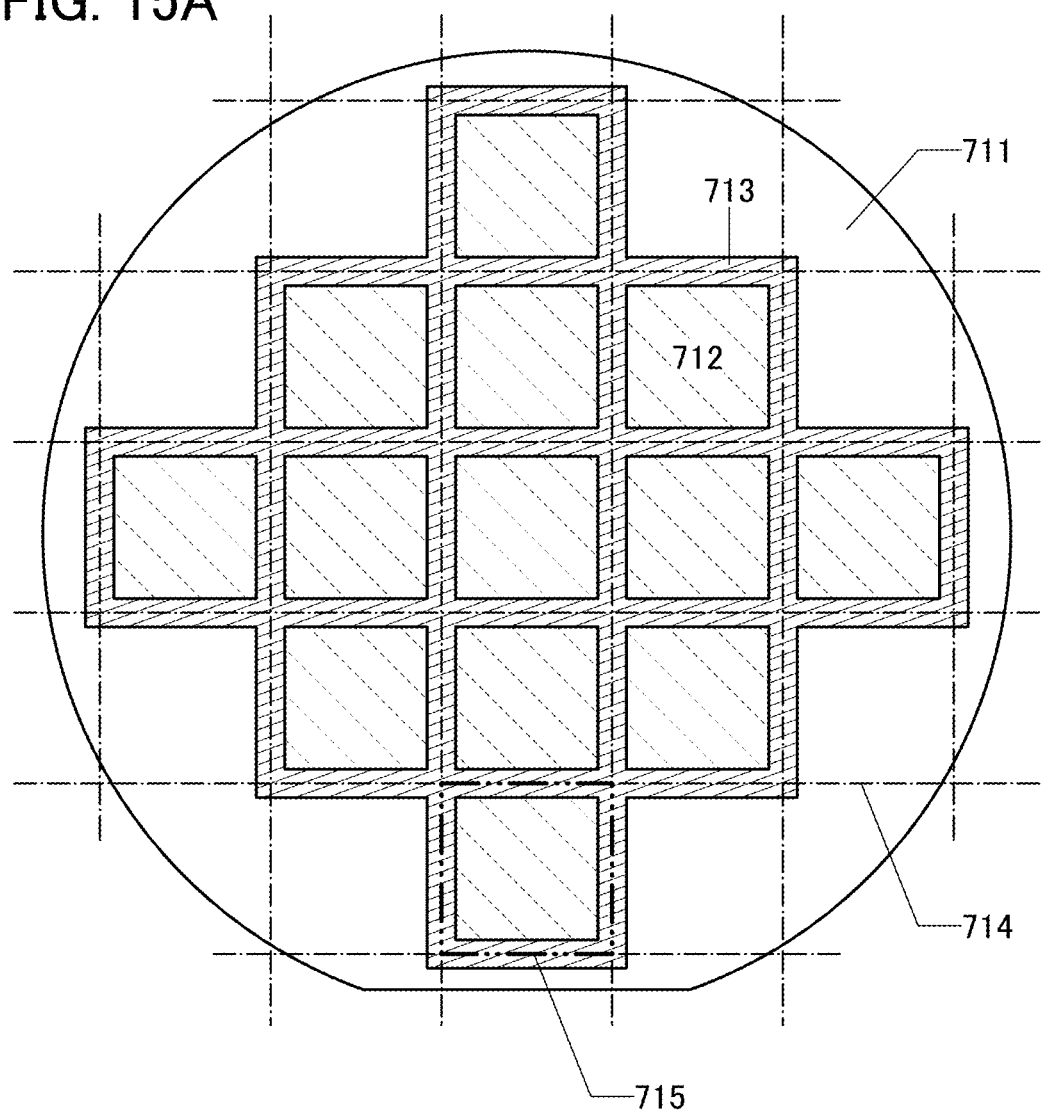
FIG. 15A is a top view of a semiconductor wafer.

FIG. 15A is a top view of a substrate 711 before dicing treatment. As the substrate 711, a semiconductor substrate (also referred to as a "semiconductor wafer") can be used, for example. A plurality of circuit regions 712 are provided over the substrate 711. A semiconductor device, a CPU, an RF tag, an image sensor, or the like of one embodiment of the present invention can be provided in the circuit region 712.

Figure 15B:
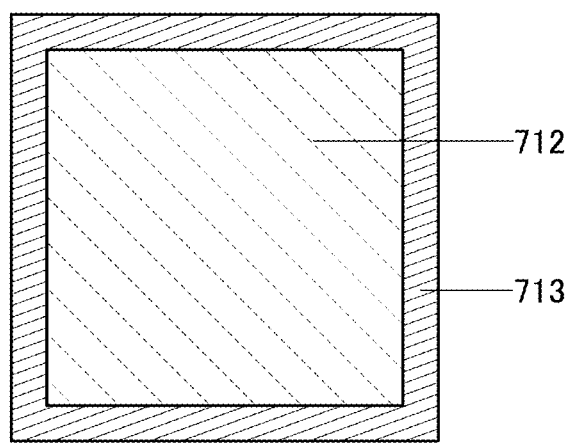
FIG. 15B is an enlarged view of a chip.

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 15B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Moreover, semiconductor devices can be manufactured with improved productivity.

For a semiconductor layer provided in the separation regions 713, a material having a band gap of 2.5 eV or more and 4.2 eV or less, preferably 2.7 eV or more and 3.5 eV or less is preferably used. The use of such a material allows accumulated charges to be released slowly; thus, the rapid move of charges due to ESD can be suppressed and electrostatic breakdown is less likely to occur.

[Electronic Component]

An example in which the chip 715 is used in an electronic component will be described with reference to FIG. 16. Note that the electronic component is also referred to as a semiconductor package or an IC package. This electronic component has a plurality of standards and names depending on a terminal extraction direction and a terminal shape.

The electronic component is completed when the semiconductor device described in the above embodiment is combined with components other than the semiconductor device in an assembly process (post-process).

Figure 16A:
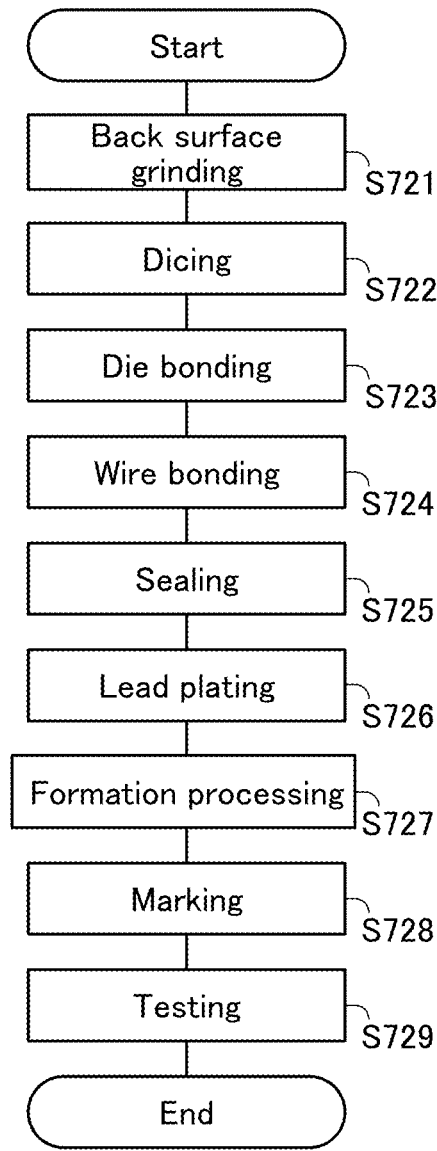
FIG. 16A is a flow chart showing an example of a fabrication process of an electronic component.

The post-process will be described with reference to a flow chart shown in FIG. 16A. After an element substrate including the semiconductor device described in the above embodiment is completed in a pre-process, a "back surface grinding step" in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, the element substrate is divided into a plurality of chips (chips 715) in a "dicing step" (Step S722). Then, the divided chips are separately picked up to be bonded to a lead frame in a "die bonding step" (Step S723). To bond a chip and a lead frame in the die bonding step, a method such as resin bonding or bonding with a tape is selected as appropriate depending on products. Note that the chip may be bonded to an interposer substrate instead of the lead frame.

Next, a "wire bonding step" of electrically connecting a lead of the lead frame and an electrode on the chip through a metal fine line (wire) is performed (Step S724). A silver line or a gold line can be used as the metal fine line. Ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (a decrease in reliability) due to moisture or dust can be reduced.

Subsequently, the lead of the lead frame is plated in a "lead plating step" (Step S726). This plating process prevents rust of the lead and enables more reliable soldering at the time of mounting the electronic component on a printed circuit board in a later step. Then, the lead is cut and processed in a "formation step" (Step S727).

Next, a "printing (marking) step" is performed on a surface of the package (Step S728). After a "testing step"

(Step S729) for checking whether an external shape is good and whether there is a malfunction, for example, the electronic component is completed (Step S729).

Figure 16B:
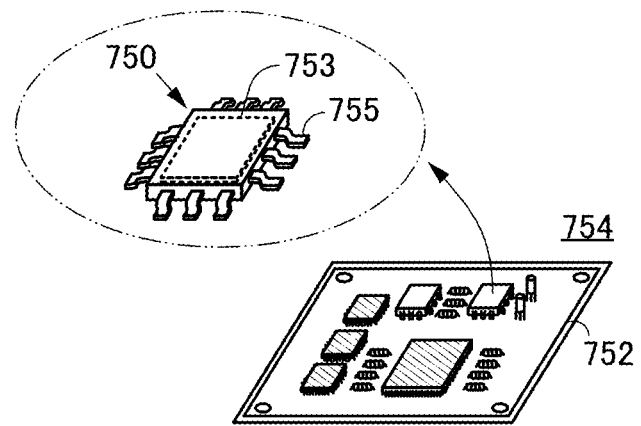
FIG. 16B is a schematic perspective view of the electronic component.

FIG. 16B is a schematic perspective view of a completed electronic component. FIG. 16B is a schematic perspective view illustrating a quad flat package (QFP) as an example of the electronic component. In an electronic component 750 in FIG. 16B, a lead 755 and a semiconductor device 753 are shown. As the semiconductor device 753, the semiconductor device described in the above embodiment, or the like, can be used.

The electronic component 750 shown in FIG. 16B is mounted on a printed circuit board 752, for example. A plurality of electronic components 750 are combined and electrically connected to each other over the printed circuit board 752; thus, a substrate on which the electronic components are mounted (a circuit board 754) is completed. The completed circuit board 754 is used in an electronic device or the like.

[Electronic Device]

Next, examples of electronic devices each including the semiconductor device of one embodiment of the present invention or the above-described electronic component will be described with reference to FIG. 17.

Examples of electronic devices including the semiconductor device of one embodiment of the present invention or the electronic component include display devices of televisions, monitors, and the like; lighting devices; desktop personal computers; laptop personal computers; word processors; image reproduction devices that reproduce still images and moving images stored in recording media such as DVDs (Digital Versatile Discs); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using electric power from the power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The semiconductor device of one embodiment of the present invention or the electronic component can be used for a communication device or the like incorporated in any of the electronic devices.

The electronic devices may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), for example.

The electronic devices can have a variety of functions such as a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium, for example.

Figure 17:
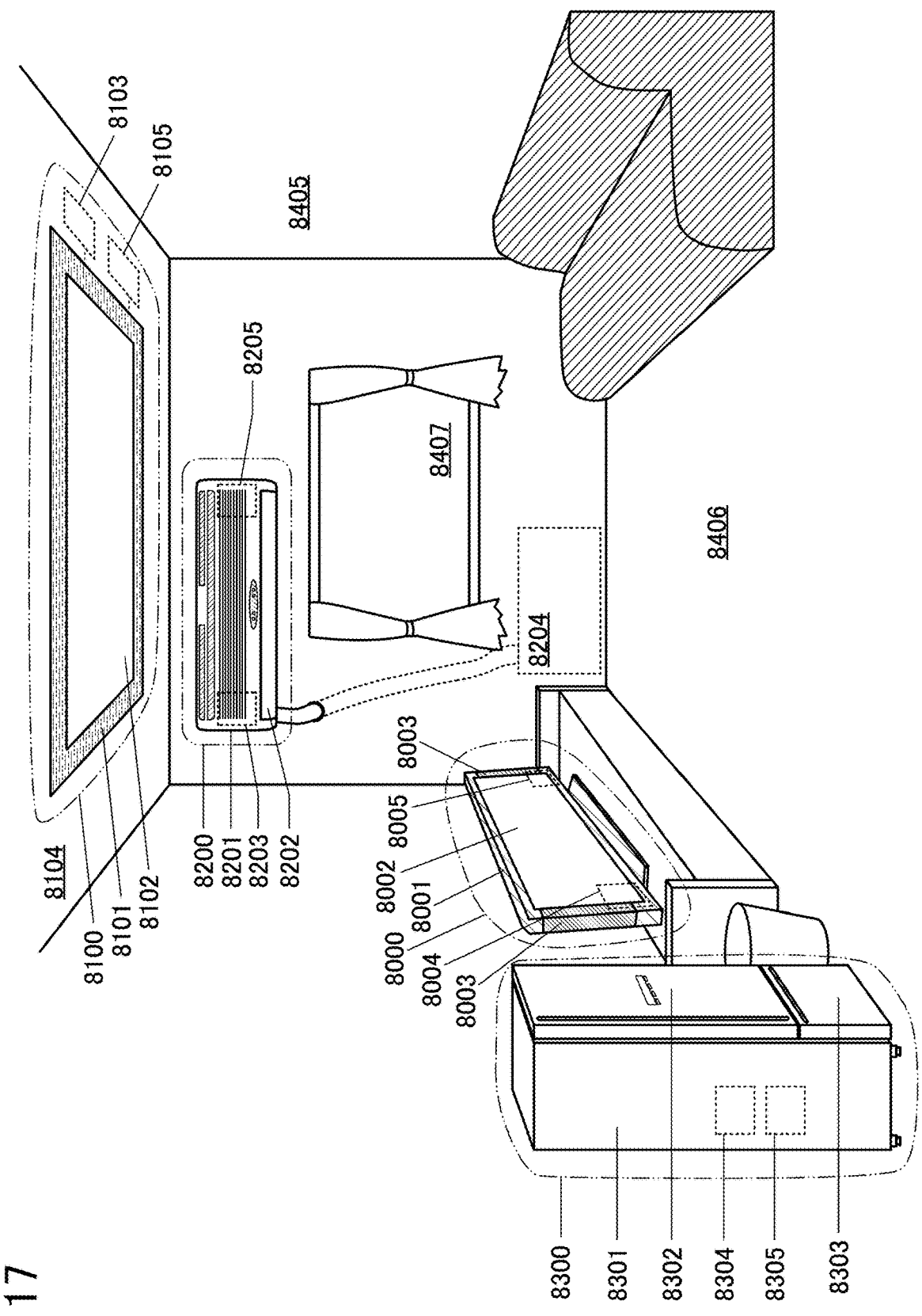
FIG. 17 is a diagram illustrating examples of electronic devices.

FIG. 17 and FIGS. 18A to 18F illustrate examples of electronic devices. In FIG. 17, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. The semiconductor device 8004 can retain control data, a control program, or the like. The semiconductor device 8004 has a communication function, and the display device 8000 can function as an IoT device. The display device 8000 can receive electric power from a commercial power supply. Alternatively, the display device 8000 can use electric power stored in the power storage device 8005.

A display device such as a liquid crystal display device, a light-emitting display device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

Note that the display device includes, in its category, all of information display devices for personal computers, advertisement displays, and the like besides TV broadcast reception.

In FIG. 17, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 17 illustrates the case where the semiconductor device 8103 is provided in a ceiling 8104 on which the housing 8101 and the light source 8102 are installed, the semiconductor device 8103 may be provided in the housing 8101. The semiconductor device 8103 can retain data such as emission luminance of the light source 8102, a control program, or the like. The semiconductor device 8103 has a communication function, and the lighting device 8100 can function as an IoT device. The lighting device 8100 can receive electric power from a commercial power supply. Alternatively, the lighting device 8100 can use electric power stored in the power storage device.

Although FIG. 17 illustrates the installation lighting device 8100 provided in the ceiling 8104 as an example, the semiconductor device of one embodiment of the present invention can be used in an installation lighting device provided in, for example, a wall 8405, a floor 8406, a window 8407, or the like other than the ceiling 8104. Alternatively, the semiconductor device of one embodiment of the present invention can be used in a tabletop lighting device or the like.

As the light source 8102, an artificial light source that emits light artificially by using electric power can be used. Specific examples of the artificial light source include an incandescent lamp, a discharge lamp such as a fluorescent lamp, and light-emitting elements such as an LED and an organic EL element.

In FIG. 17, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 17 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can retain control data, a control program, or the like of the air conditioner. The semiconductor device 8203 has a communication function, and the air conditioner can function as an IoT device. The air conditioner can receive electric power from a commercial power supply. Alternatively, the air conditioner can use electric power stored in the power storage device 8205.

Although FIG. 17 illustrates the split-type air conditioner including the indoor unit and the outdoor unit as an example, the semiconductor device of one embodiment of the present invention can be used in an air conditioner in which the functions of an indoor unit and an outdoor unit are integrated in one housing.

In FIG. 17, an electric refrigerator-freezer 8300 is an example of an electronic device including a semiconductor device 8304 of one embodiment of the present invention. Specifically, the electric refrigerator-freezer 8300 includes a housing 8301, a refrigerator door 8302, a freezer door 8303, the semiconductor device 8304, a power storage device 8305, and the like. In FIG. 17, the power storage device 8305 is provided in the housing 8301. The semiconductor device 8304 can retain control data, a control program, or the like of the electric refrigerator-freezer 8300. The semiconductor device 8304 has a communication function, and the electric refrigerator-freezer 8300 can function as an IoT device. The electric refrigerator-freezer 8300 can receive electric power from a commercial power supply. Alternatively, the electric refrigerator-freezer 8300 can use electric power stored in the power storage device 8305.

Figure 18A:
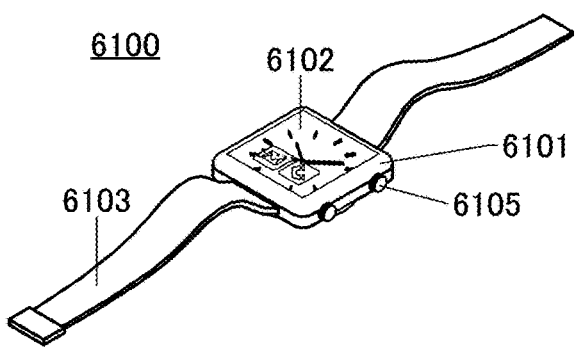
FIG. 18A to FIG. 18F are diagrams illustrating examples of electronic devices.

FIG. 18A illustrates an example of a watch-type portable information terminal. A portable information terminal 6100 includes a housing 6101, a display portion 6102, a band 6103, operation buttons 6105, and the like. The portable information terminal 6100 further includes a secondary battery and the semiconductor device of one embodiment of the present invention or the electronic component. The portable information terminal 6100 including the semiconductor device of one embodiment of the present invention or the electronic component can function as an IoT device.

Figure 18B:
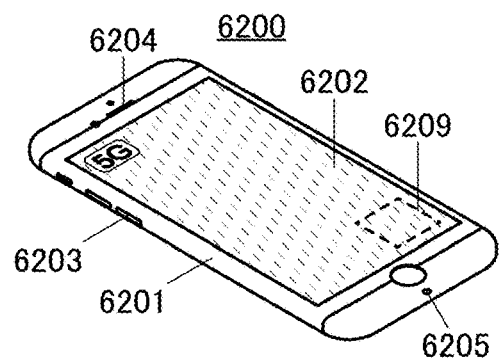

FIG. 18B illustrates an example of a mobile phone. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device of one embodiment of the present invention or the electronic component. The portable information terminal 6200 including the semiconductor device of one embodiment of the present invention or the electronic component can function as an IoT device.

Figure 18C:
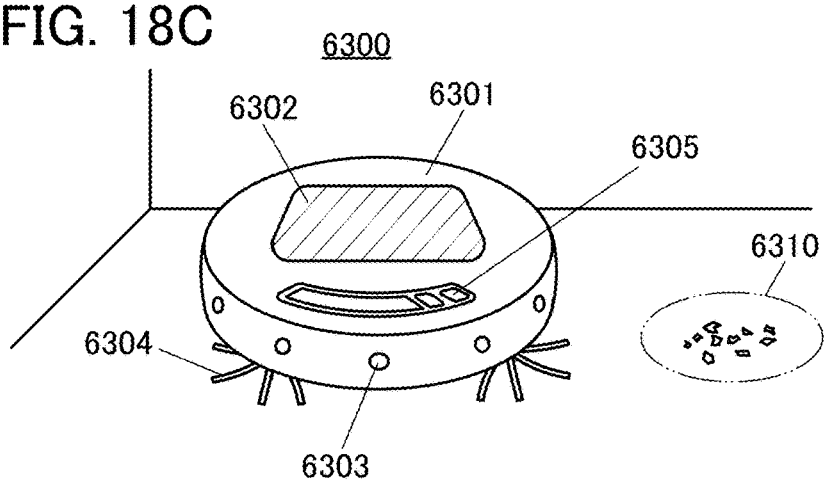

FIG. 18C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although a tire, an inlet, and the like are not illustrated, the cleaning robot 6300 is provided with the tire, the inlet, and the like. The cleaning robot 6300 is self-propelled, detects dust 6310, and sucks up the dust through the inlet provided on the bottom surface.

For example, the cleaning robot 6300 can determine whether there is an obstacle such as a wall, furniture, or a step by analyzing images shot by the cameras 6303. In the case where the cleaning robot 6300 detects an object that is likely to be caught in the brush 6304 (e.g., a wire) by image analysis, the rotation of the brush 6304 can be stopped. The cleaning robot 6300 further includes a secondary battery and the semiconductor device of one embodiment of the present invention or the electronic component. The cleaning robot 6300 including the semiconductor device of one embodiment of the present invention or the electronic component can function as an IoT device.

Figure 18D:
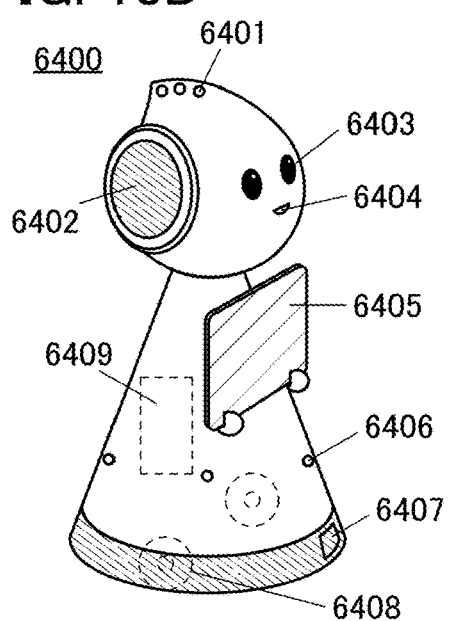

FIG. 18D illustrates an example of a robot. A robot 6400 illustrated in FIG. 18D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user using the microphone 6402 and the speaker 6404.

The display portion 6405 has a function of displaying various kinds of information. The robot 6400 can display information desired by a user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The upper camera 6403 and the lower camera 6406 each have a function of shooting an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting device of one embodiment of the present invention can be used for the display portion 6405.

The robot 6400 further includes a secondary battery and the semiconductor device of one embodiment of the present invention or the electronic component. The robot 6400 including the semiconductor device of one embodiment of the present invention or the electronic component can function as an IoT device.

Figure 18E:
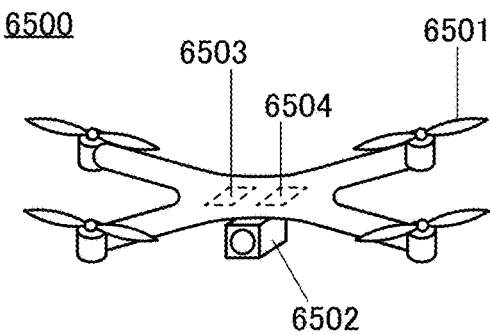

FIG. 18E illustrates an example of a flying object. A flying object 6500 illustrated in FIG. 18E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there is an obstacle in the way of the movement. Moreover, the electronic component 6504 can estimate the remaining battery level from a change in the power storage capacity of the battery 6503. The flying object 6500 further includes the semiconductor device of one embodiment of the present invention or the electronic component. The flying object 6500 including the semiconductor device of one embodiment of the present invention or the electronic component can function as an IoT device.

Figure 18F:
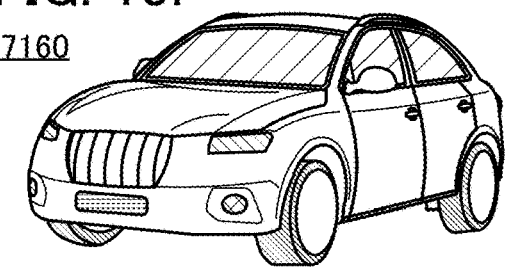

FIG. 18F illustrates an example of an automobile. An automobile 7160 includes an engine, tires, a brake, a steering gear, a camera, and the like. The automobile 7160 further includes the semiconductor device of one embodiment of the present invention or the electronic component. The automobile 7160 including the semiconductor device of one embodiment of the present invention or the electronic component can function as an IoT device.

The composition, structure, method, and the like described in this embodiment can be used in combination as appropriate with the compositions, structures, methods, and the like described in the other embodiments.

Embodiment 6

The use of the OS transistor described in this specification and the like enables a normally-off CPU (also referred to as "Noff CPU") to be obtained. Note that the Noff CPU is an integrated circuit including a normally-off transistor, which is in a non-conduction state (also referred to as an off state) even when a gate voltage is 0 V.

In the Noff CPU, power supply to a circuit that does not need to operate can be stopped so that the circuit can be brought into a standby state. The circuit brought into the standby state because of the stop of power supply does not consume power. Thus, the power usage of the Noff CPU can be minimized. Moreover, the Noff CPU can hold data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff CPU can be reduced without a significant decrease in operation speed.

The Noff CPU can be suitably used for a small-scale system such as an IoT (Internet of Things) end device (also referred to as endpoint microcomputer) 803 in the IoT field, for example.

Figure 19:
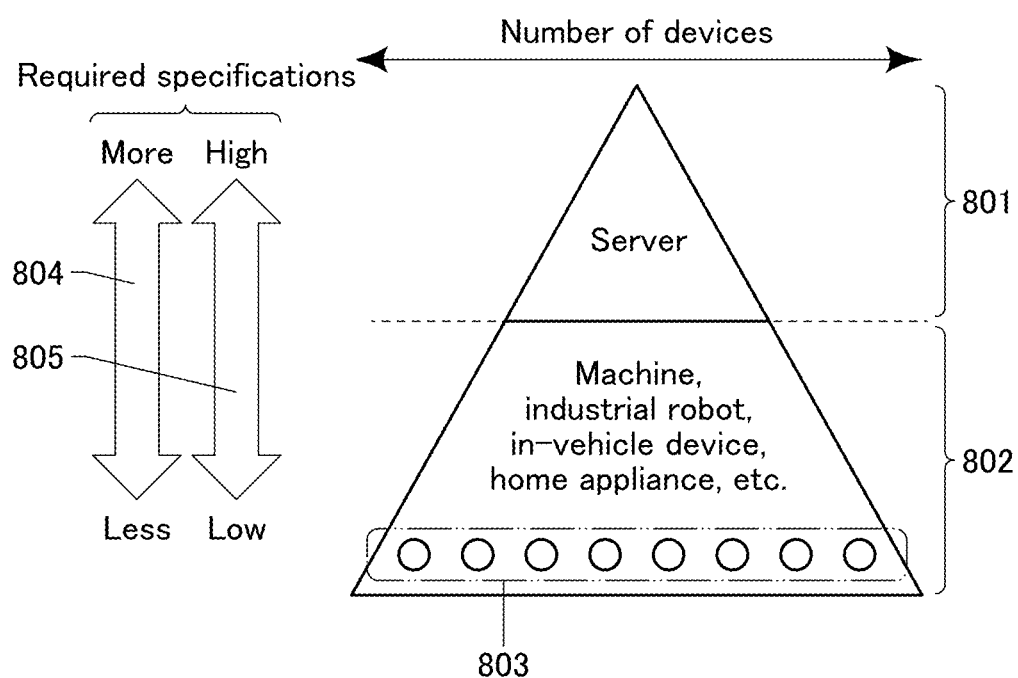
FIG. 19 is a diagram illustrating a hierarchical structure of an IoT network and tendencies of required specifications.

FIG. 19 shows a hierarchical structure of an IoT network and tendencies of required specifications. FIG. 19 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

At the upper level, higher processing performance is required rather than lower power consumption. Thus, a high-performance CPU, a high-performance GPU, a large-scale SoC (System on a Chip), and the like are used in the cloud field 801. Furthermore, at the lower level, lower power consumption is required rather than higher processing performance, and the number of devices is explosively increased. The semiconductor device of one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 20:
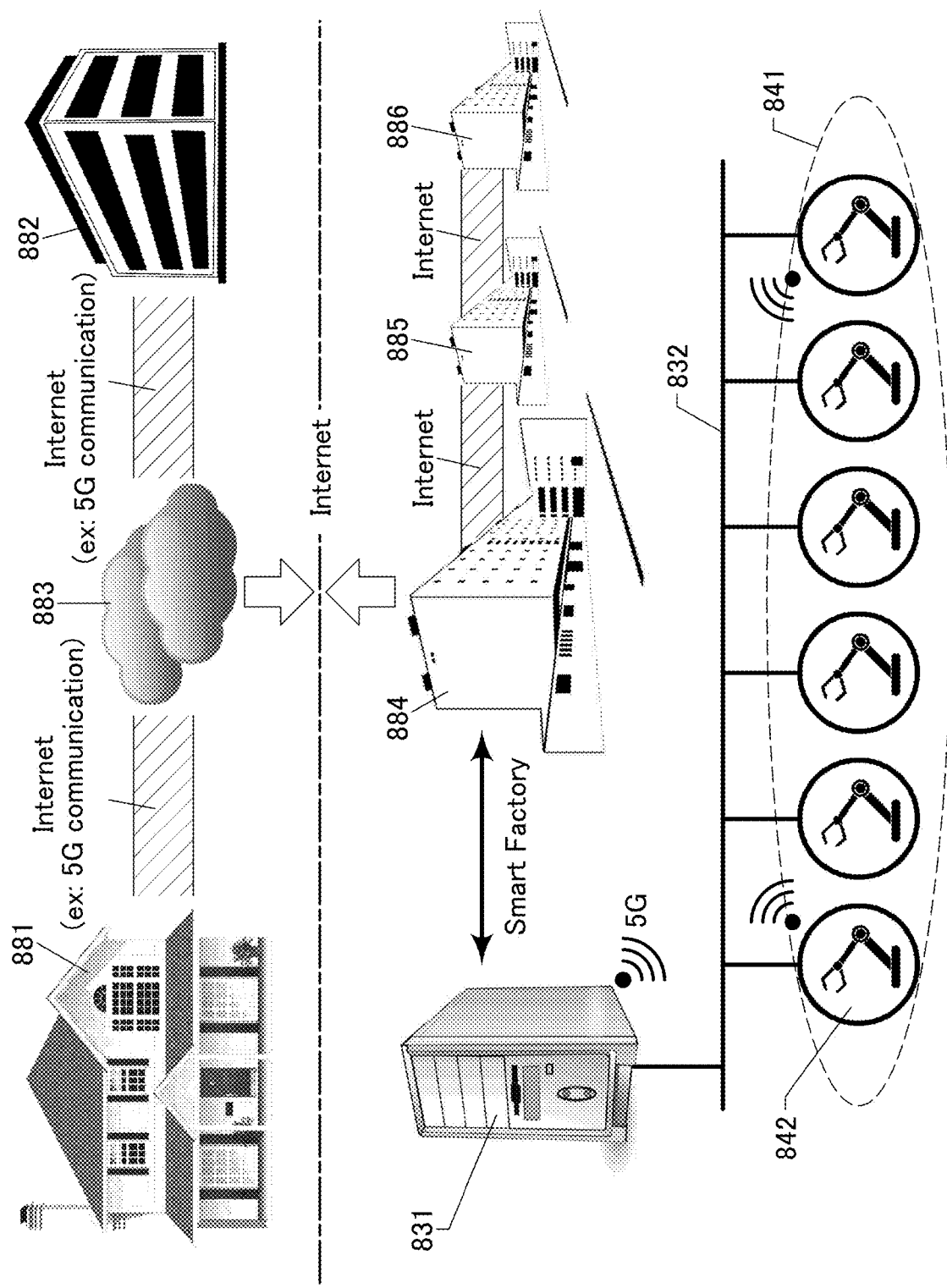
FIG. 20 is a conceptual diagram of factory automation.

FIG. 20 is a conceptual diagram of factory automation as an application example of the endpoint microcomputer. A factory 884 is connected to a cloud 883 through Internet connection. The cloud 883 is connected to a home 881 and an office 882 through Internet connection. The Internet connection may be wired communication or wireless communication. In the case of wireless communication, for example, wireless communication based on a communication standard such as the fourth-generation mobile communication system (4G) or the fifth-generation mobile communication system (5G) can be performed using the semiconductor device of one embodiment of the present invention for a communication device. The factory 884 may be connected to a factory 885 and a factory 886 through Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through a M2M (Machine-to-Machine) interface 832. As the M2M interface 832, for example, industrial Ethernet ("Ethernet" is a registered trademark), which is a kind of wired communication, or local 5G, which is a kind of wireless communication, may be used.

A manager of the factory can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories, under the name "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff CPU. Although the embedded field of IoT sometimes requires quick response, the use of the Noff CPU allows high-speed return from a standby state.

The composition, structure, method, and the like described in this embodiment can be used in combination as appropriate with the compositions, structures, methods, and the like described in the other embodiments and the like.

Notes on Description of this Specification and the Like

The description of the above embodiments and each structure in the embodiments are noted below.

One embodiment of the present invention can be constituted by combining, as appropriate, the structure described in each embodiment with any of the structures described in the other embodiments. In addition, in the case where a plurality of structure examples are described in one embodiment, the structure examples can be combined as appropriate.

Note that contents (or part thereof) described in one embodiment can be applied to, combined with, or replaced with other contents (or part thereof) described in the embodiment and/or contents (or part thereof) described in another embodiment or other embodiments.

Note that in each embodiment, contents described in the embodiment are contents described using a variety of drawings or contents described with text disclosed in the specification.

Note that by combining a drawing (or part thereof) described in one embodiment with another part of the drawing, a different drawing (or part thereof) described in the embodiment, and/or a drawing (or part thereof) described in another embodiment or other embodiments, much more drawings can be created.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, they are not limited to the illustrated scale. Note that the drawings are schematically shown for clarity, and shapes, values, or the like are not limited to those shown in the drawings. For example, fluctuation in signal, voltage, or current due to noise, fluctuation in signal, voltage, or current due to a difference in timing, or the like can be included.

Furthermore, the positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relation of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electric signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

10: wireless communication device, 11: application processor, 12: baseband processor, 13: integrated circuit, 14:

memory, 15: battery, 16: power management IC, 17: display portion, 18: camera portion, 19: operation input portion, 20: audio IC, 21: microphone, 22: speaker, 100: semiconductor device, 101: low noise amplifier, 102: mixer, 103: low-pass filter, 104: variable gain amplifier, 105: analog-to-digital converter circuit, 106: interface portion, 107: oscillator circuit, 108: variable gain amplifier, 109: low-pass filter, 110: mixer, 111: power amplifier, 120: constant current circuit, 121: transistor, 122: transistor, 123: transistor, 124: capacitor, 125: transistor, 130: load, 130*b*: load, 131: resistor, 132: transistor, 133: transistor, 134: capacitor, 140: buffer circuit, 140*b*: buffer circuit, 141: resistor, 142: transistor, 143: transistor, 144: transistor, 145: transistor, 146: capacitor, 147: transistor, 148: resistor, 149: resistor, 150: digital signal output circuit, 151: voltage generation circuit, 160: constant current circuit, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: insulator, 500: transistor, 500A: transistor, 500B: transistor, 503: conductor, 503*a*: conductor, 503*b*: conductor, 510: insulator, 512: insulator, 513: insulator, 514: insulator, 516: insulator, 518: conductor, 520: insulator, 522: insulator, 524: insulator, 530: oxide, 530*a*: oxide, 530*b*: oxide, 540*a*: conductor, 540*b*: conductor, 542*a*: conductor, 542*b*: conductor, 543*a*: region, 543*b*: region, 544: insulator, 545: insulator, 546: conductor, 548: conductor, 550: transistor, 552: insulator, 560: conductor, 560*a*: conductor, 560*b*: conductor, 574: insulator, 580: insulator, 581: insulator, 582: insulator, 586: insulator, 600: capacitor, 610: conductor, 612: conductor, 620: conductor, 630: insulator, 640: insulator, 711: substrate, 712: circuit region, 713: separation region, 714: separation line, 715: chip, 750: electronic component, 752: printed circuit board, 753: semiconductor device, 754: circuit board, 755: lead, 801: cloud field, 802: field, 804: power consumption, 805: processing performance, 831: master device, 832: interface, 841: IoT end device, 842: industrial robot, 881: home, 882: office, 883: cloud, 884: factory, 885: factory, 886: factory, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: flying object, 6501: propeller, 6502: camera, 6503: battery, 6504: electronic component, 7160: automobile, 8000: display device, 8001: housing, 8002: display portion, 8003: speaker portion, 8004: semiconductor device, 8005: power storage device, 8100: lighting device, 8101: housing, 8102: light source, 8103: semiconductor device, 8104: ceiling, 8105: power storage device, 8200: indoor unit, 8201: housing, 8202: air outlet, 8203: semiconductor device, 8204: outdoor unit, 8205: power storage device, 8300: electric refrigerator-freezer, 8301: housing, 8302: refrigerator door, 8303: freezer door, 8304: semiconductor device, 8305: power storage device, 8405: wall, 8406: floor, 8407: window

The invention claimed is:

1. A semiconductor device comprising:
a plurality of constant current circuits each including a first transistor, a second transistor, and a third transistor,
wherein a gate of the first transistor is electrically connected to one of a source and a drain of the third transistor,
wherein a gate of the second transistor is electrically connected to a first wiring which transmits a digital signal,
wherein the other of the source and the drain of the third transistor is electrically connected to a second wiring which transmits an analog potential,
wherein a first current corresponding to the analog potential flows through the first transistor,
wherein the second transistor is configured to control the first current which flows through the first transistor, in response to the digital signal, and
wherein the first transistor, the second transistor, and the third transistor each include a semiconductor layer including an oxide semiconductor in a channel formation region.

2. The semiconductor device according to claim 1, further comprising:
a load configured to generate a voltage corresponding to currents flowing through the plurality of constant current circuits; and
a buffer circuit configured to output the voltage as an output voltage.

3. The semiconductor device according to claim 1,
wherein the plurality of constant current circuits are provided to overlap a circuit, and
wherein the circuit includes a transistor including silicon in a channel formation region.

4. The semiconductor device according to claim 2,
wherein the load includes a fourth transistor, and
wherein the fourth transistor includes a semiconductor layer including an oxide semiconductor in a channel formation region.

5. The semiconductor device according to claim 2,
wherein the buffer circuit includes a fifth transistor, and
wherein the fifth transistor includes a semiconductor layer including an oxide semiconductor in a channel formation region.

6. The semiconductor device according to claim 1,
wherein the digital signal includes an inverted signal and a non-inverted signal.

7. The semiconductor device according to claim 1,
wherein one of a source and a drain of the first transistor is electrically connected to one of a source and a drain of the second transistor, and
wherein a gate of the third transistor is electrically connected to a wiring which transmits a selection signal.

8. The semiconductor device according to claim 1,
wherein the oxide semiconductor includes indium, gallium, and zinc.

* * * * *